(12) United States Patent
Ohtsuki

(10) Patent No.: US 7,136,402 B1
(45) Date of Patent: Nov. 14, 2006

(54) LASER DEVICE AND EXPOSURE METHOD

(75) Inventor: Tomoko Ohtsuki, Allentown, PA (US)

(73) Assignee: Nikon Corporation, Tokyo (JP)

( * ) Notice: Subject to any disclaimer, the term of this patent is extended or adjusted under 35 U.S.C. 154(b) by 165 days.

(21) Appl. No.: 10/070,684

(22) PCT Filed: Sep. 8, 2000

(86) PCT No.: PCT/JP00/06131

§ 371 (c)(1),
(2), (4) Date: Sep. 12, 2002

(87) PCT Pub. No.: WO01/20397

PCT Pub. Date: Mar. 22, 2001

(30) Foreign Application Priority Data

Sep. 10, 1999  (JP) ............................................. 11-258133

(51) Int. Cl.
*H01S 3/10* (2006.01)

(52) U.S. Cl. ................................ 372/22; 372/92; 372/6

(58) Field of Classification Search .................. 372/22, 372/92, 6
See application file for complete search history.

(56) References Cited

U.S. PATENT DOCUMENTS

| 5,745,284 | A | * | 4/1998 | Goldberg et al. ............ 359/344 |
| 5,838,709 | A | * | 11/1998 | Owa .............................. 372/68 |
| 6,590,698 | B1 | * | 7/2003 | Ohtsuki et al. .............. 359/326 |
| 2002/0191171 | A1 | * | 12/2002 | Nishi .......................... 355/67 |
| 2003/0081192 | A1 | * | 5/2003 | Nishi .......................... 355/69 |

FOREIGN PATENT DOCUMENTS

| EP | 0 919 852 A1 | 6/1999 |
| EP | 1 063 742 A1 | 12/2000 |
| JP | A 3-88379 | 4/1991 |
| JP | A 8-334803 | 12/1996 |
| JP | A 9-148658 | 6/1997 |
| JP | A 10-339891 | 12/1998 |
| JP | A 11-52443 | 2/1999 |
| JP | A 11-160746 | 6/1999 |

OTHER PUBLICATIONS

Petrov et al., "Vacuum ultraviolet application of $Li_2B_4O_7$ crystals: Generation of 100fs pulses down to 170nm" Journal of Applied Physics, vol. 84, No. 11, Dec. 1, 1998, pp. 5887–5892.

Yoshimura et al., "Noncritically phase–matched frequency conversion in $Cd_xY_{1-x}Ca_4O(BO_3)_3$ crystal", Optics Letters, vol. 24, No. 4, Feb. 15, 1999, pp. 193–195.

Zhang–Gui Hu, et al., "A New Nonlinear Optical Borate Crystal $K_2Al_2B_2O_7$(KAB)", Japanese Journal of Applied Physics, vol. 37 (1998), No. 10 A, (Part 2 Letters), Oct. 1, 1998, pp. L1093–L1094.

Zhang et al., "Growth and noncrirical phase–matching third–harmonic–generation of $Gd_xY_{1-x}Ca_4O(BO_3)_3$" Journal of Crystal Growth, vol. 213, No. 3/4, Jun. 1, 2000, pp. 415–418.

* cited by examiner

*Primary Examiner*—Armando Rodriquez
(74) *Attorney, Agent, or Firm*—Oliff & Berridge, PLC

(57) ABSTRACT

A laser device which can be used as a light source for an exposure device, can be downsized, and is easy to maintain. A laser beam (LB6) emitted from a DFB (Distributed feedback) semiconductor laser, for example, and amplified by an optical fiber amplifier is passed through non-linear optical crystals (502, 503, 504) to be sequentially doubled in frequency to thereby generate an ultraviolet-region laser beam (LB5) consisting of an octuple wave. A GdYCOB, that is, $Gd_xY_{1-x}Ca_4O(BO_3)_3$ crystal ($0 \leq x \leq 1$) is used for the non-linear optical crystal (503) for a double wave-to-quadruple wave conversion, and a KAB, that is, $K_2Al_2B_4O_7$ crystal for the non-linear optical crystal (504) for a quadruple wave-to-octuple wave conversion. The non-linear optical crystals (502–504) are all fine-tuned in phase match angle by temperature controllers (521–523) respectively.

64 Claims, 10 Drawing Sheets

FIG.9
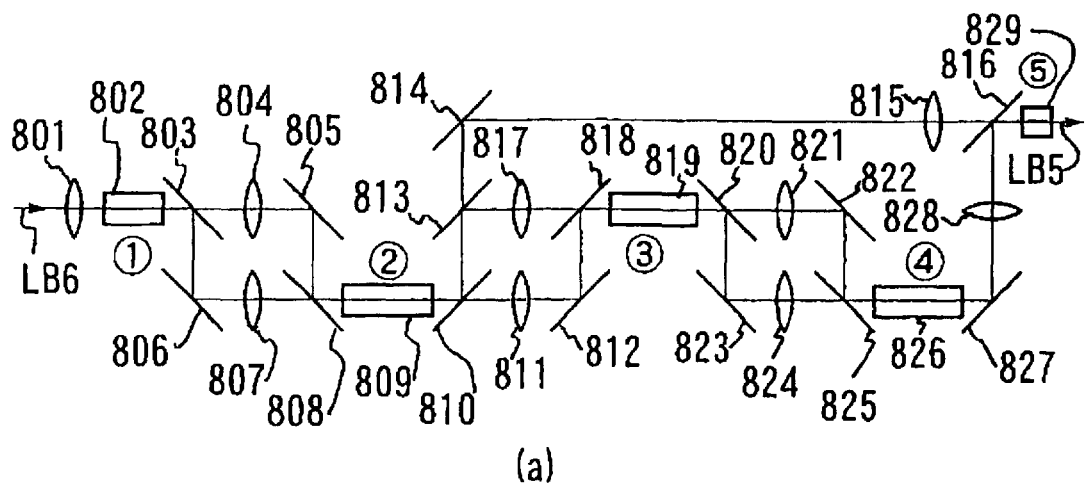
(a)
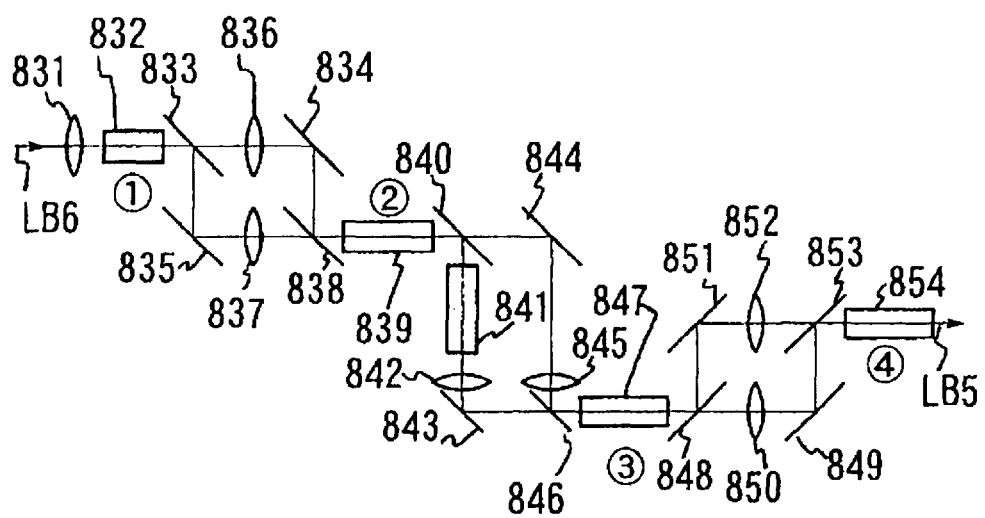
(b)

FIG.10
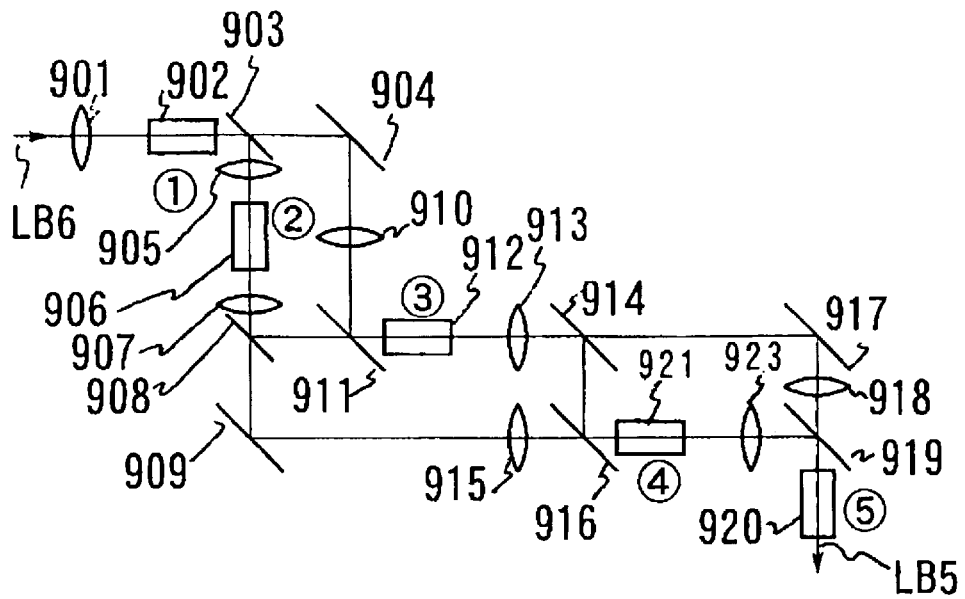
(a)
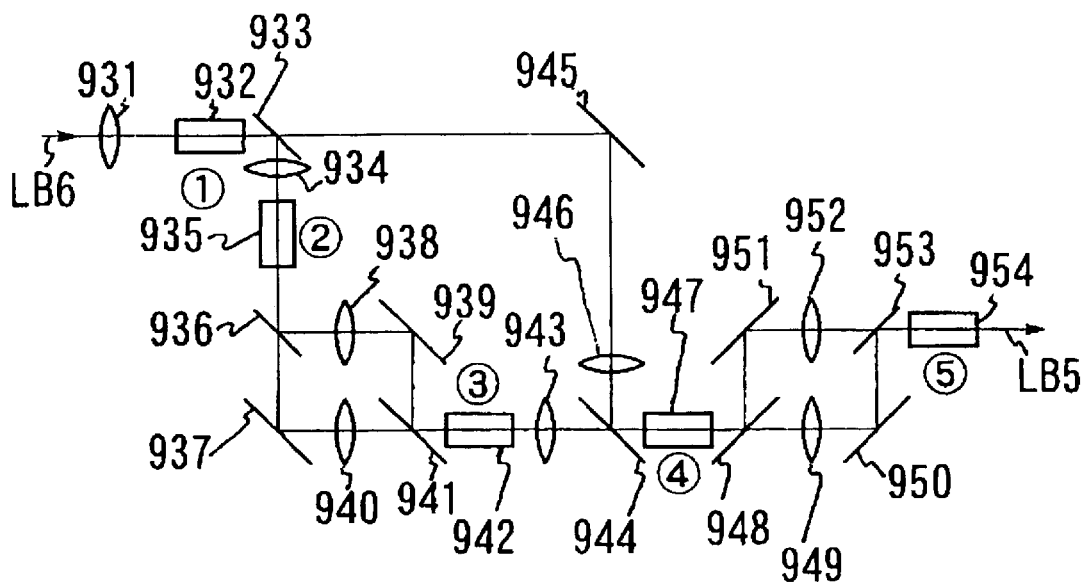
(b)

LASER DEVICE AND EXPOSURE METHOD

This application is the international phase under 35 U.S.C. 371 of prior PCT International Application No. PCT/JP00/06131 which has an International filing date of Sep. 8, 2000 which designated the United States of America, the entire contents of which are hereby incorporated by reference.

TECHNICAL FIELD

The present invention relates to a laser device that generates ultraviolet light and an exposure method using this device. More specifically, the present invention is preferably used as, for example, an exposure light source or a measuring light source of an exposure apparatus used in a photolithography process for manufacturing microdevices, such as semiconductor devices, image pickup devices (such as CCDs), liquid crystal display devices, plasma display devices, and thin-film magnetic heads.

BACKGROUND ART

For example, an exposure apparatus used in a photolithography process for manufacturing a semiconductor integrated circuit optically reduces and projectively exposes a circuit pattern accurately rendered on a reticle (photomask) used as a mask, onto the photoresist-coated surface of a wafer as a substrate. In the exposure, shortening of an exposure-light wavelength (exposure wavelength) is one of the most simple and effective methods to reduce the minimum pattern size (resolution) on the wafer. Hereinbelow, a description will be made regarding conditions that should be provided to configure an exposure light source, in addition to those for the implementation of the wavelength shortening of the exposure-light.

First, for example, an optical output of several watts is required. The optical output is required to reduce time necessary for exposure and transfer of an integrate circuit pattern and thereby to increase a throughput.

Second, when the exposure light is ultraviolet light having a wavelength of 300 nm or shorter, an optical material which can be used for a reflector member (lens) of a projection optical system is limited, and hence the difficulty increases for compensation of the chromatic aberration. For this reason, monochromaticity of the exposure light is required, and the spectral linewidth needs to be controlled to be about 1 pm or less.

Third, the timelike coherence increases in association with the reduction in the spectral linewidth. As such, when light having a narrow spectral linewidth (wavelength width) is emitted as it is, an unnecessary interference pattern called "speckle" is generated. Therefore, in the exposure light source, the spatial coherence needs to be reduced to suppress generation of the speckles.

One of conventional short-wavelength light sources satisfying these conditions is a light source using an excimer laser in which the laser oscillation wavelength itself is a short wavelength. Another conventional short-wavelength light source is of a type using harmonic waves generation of an infrared or visible-range laser.

A KrF excimer laser (having a wavelength of 248 nm) is used as the above-described former short-wavelength light source. Currently, an exposure light source using a shorter-wavelength ArF excimer laser (having a wavelength of 193 nm) is under development. In addition, a proposal has been made for use of an $F_2$ laser (having a wavelength of 157 nm), which is one of excimer lasers. However, these excimer lasers are of a large scale, and the oscillatory frequency thereof is at about a level of several kHz in a present stage. This requires a per-pulse energy to be increased to increase a per-unit-time radiation energy. This arises various problems. For example, the transmittance of an optical component tends to vary because of so-called compaction and the like, complicated maintenance is required and costs are increased.

As the aforementioned latter method, there is a method that uses a secondary nonlinear optical effect of a nonlinear optical crystal, and thereby converts long wavelength light (infrared light or visible light) into ultraviolet light of short wavelength. For example, a publication ("Longitudinally diode pumped continuous wave 3.5W green laser", L. Y. Liu, M. Oka, W. Wiechmann and S. Kubota; Optics Letters, vol. 19, p189(1994)) discloses a laser source that performs a wavelength conversion of light emitted from a solid-state laser excited by a semiconductor laser beam. The publication regarding the aforementioned conventional example describes a method of performing a wavelength conversion for a 1,064-nm laser beam generated by an Nd:YAG laser by using a nonlinear optical crystal, and thereby generates light of a 4th-harmonic-wave of 266-nm. The solid-state laser is a generic name of lasers using a solid-state laser medium.

In addition, for example, Japanese Patent Application Laid-Open No. 8-334803 and corresponding U.S. Pat. No. 5,838,709 proposed an array laser. The array laser is formed to include a plurality of laser elements in a matrix form (for example, a 10×10 matrix). Each of the laser elements is formed to include a laser-beam generating section including a semiconductor laser, and a wavelength conversion section for performing wavelength conversion for light emitted from the laser-beam generating section into ultraviolet light by using a nonlinear optical crystal.

The conventional array laser thus constituted enables an overall-device light output to be a high output while mitigating light outputs of the individual laser elements to be lower. This enables burden onto the individual nonlinear optical crystals to be lessened. On the other hand, however, since the individual laser elements are independent of one another, to apply the lasers to an exposure apparatus, oscillatory spectra of the overall laser elements need to be set identical with one another at the overall width up to a level of 1 pm.

For the above reason, for example, the length of a resonator of each of the laser elements needs to be adjusted, or a wavelength-selecting device needs to be inserted into the resonator to cause the laser element to autonomously oscillate with the same wavelength in a single longitudinal mode. In this connection, these methods arises other problems. For example, the aforementioned adjustment requires a sensitive arrangement; and in proportion to the increase in the constituent laser elements, the complexity of the configuration needs to be increased to cause the overall devices to oscillate with the same wavelength.

On the other hand, known methods of actively unifying the wavelengths of the plurality of lasers include an injection seed method (for example, see, "Walter Koechner; Solid-state Laser Engineering, 3rd Edition, Springer Series in Optical Science, Vol.1, Springer-Verlag, ISBN 0-387-53756-2, pp.246–249"). According to this method, light from a single laser light source having a narrow spectral linewidth is split into a plurality of laser elements, and the laser beams are used as induction waves to tune the individual laser elements, and in addition, to causes the spectral linewidths to be narrow bandwidths. However, the method has problems in that it requires an optical system for separating the seed light into the individual laser elements and an oscillatory-wavelength tuning control section, thereby increase complexity of the configuration.

In addition, the array laser as described above enables the overall device to be significantly smaller than that with the conventional excimer laser, it still causes difficulty in packaging so as to reduce the diameter of overall arrayed output beams to several centimeters or smaller. The array laser thus configured has additional problems. For example, each of the arrays requires the wavelength conversion section, thereby increasing the cost. In addition, suppose misalignment has occurred in a part of the laser elements constituting the array, or damage has occurred with the constituent optical elements. In this case, the overall array needs to be once disassembled, the defective part of the laser elements needs to be taken out for repair, and the array needs to be reassembled after repair.

In view of the above, a primary object of the present invention is to provide a laser device that can be used for a light source of the exposure apparatus, that enables the exposure apparatus to be miniaturized, and that enables the maintainability to be enhanced.

A second object of the present invention is to provide a laser device that enables the oscillatory frequency to be increased, and enables the spatial coherence to be reduced, as well as enabling the overall oscillatory spectral linewidth to be narrowed with a simple configuration.

Additional object of the present invention is to provide an exposing method using such a laser divice as an exposure light source, an exposure apparatus that is compact and that has high flexibility, and an efficient manufacturing method of the aforementioned exposure apparatus.

DISCLOSURE OF THE INVENTION

Each of the laser devices of the present invention basically generates ultraviolet light and includes a laser light generator section which generates mono-wavelength laser light in a wavelength range of from an infrared region to a visible region; an optical amplifier section including an optical fiber amplifier which amplifies the laser light generated by the laser light generator section; and a wavelength conversion section which performs wavelength conversion of the laser light amplified by the optical amplifier section into ultraviolet light by using a nonlinear optical crystal.

The laser divice in each of the above-described aspects of the present invention allows use of a light source which is small and which has a narrow oscillatory spectrum such as, for example, a distributed feed back (DFB) semiconductor laser controlled in oscillation wavelength or a fiber laser. High-output mono-wavelength ultraviolet light which has a narrow spectral width can be obtained in the following manner. A mono-wavelength laser beam output from the laser generator section is amplified using the optical fiber amplifier; and thereafter, the laser light is converted into ultraviolet light through the nonlinear optical crystal. As such, the present invention enables the provision of the laser device which is small and which has high maintainability.

In this case, for example, one of the following amplifiers can be used for the optical fiber amplifier: an erbium(Er)-doped fiber amplifier(EDFA), a ytterbium(Yb)-doped fiber amplifier(YDFA), a praseodymium(Pr)-doped fiber amplifier(PDFA), and a thulium(Tm)-doped fiber amplifier (TDFA).

Concerning the configuration of the wavelength conversion section of the present invention, ultraviolet light formed of a harmonic wave having a frequency of an arbitrary integer multiple (a wavelength of an integer division of 1) with respect to that of the fundamental wave can be easily output through combination of second-order harmonic generation (SHG) by a plurality of nonlinear optical crystals and sum frequency generation (SFG). In this case, the conversion efficiency needs to be increased as high as possible.

In a first laser device of the present invention, wavelength conversion section includes a plurality of nonlinear optical crystals which perform wavelength conversion for the laser light amplified by the optical amplifier section, and a plurality of temperature controller which respectively perform temperature control for the plurality of nonlinear optical crystals to tune the phase matching angle at the time of wavelength conversion. By tuning (such as final finetuning) of the phase matching angles of all nonlinear crystals by performing the temperature control, the conversion efficiency can be improved by the simple control. In addition, when the phase matching for wavelength conversion is performed through the temperature control of the crystals, non-critical phase matching (NCPM) can be employed. Use of the NCPM offers the advantage of not causing so-called "walk-off", which refers to angle deviation between a fundamental wave and a harmonic wave thereof in a nonlinear optical crystal. In addition, the acceptance angle in phase-matching angle is larger in value by about two digits. As such, a large alignment error tolerance can be set, and therefore the manufacture/assembly is facilitated.

In a second laser device of the present invention, a lithium tetraborate ($Li_2B_4O_7$) crystal (i.e., an LB4 crystal) is used for at least one of a plurality of nonlinear optical crystals in the wavelength conversion section. The LB4 crystal is used, particularly for a portion which generates an eighth-order harmonic wave as ultraviolet light from a fundamental wave and a seventh-order harmonic wave thereof according to sum frequency generation. Thereby, high conversion efficiency can be obtained, and the laser device is imparted with anti-ultraviolet light durability.

In a third laser device of the present invention, a $K_2Al_2B_4O_7$ crystal (i.e., a KAB crystal) is used for at least one of the plurality of nonlinear optical crystals in the wavelength conversion section. The LB4 crystal is used, particularly for a portion which generates an eighth-order harmonic wave as ultraviolet light from a fundamental wave and a seventh harmonic wave thereof according to sum frequency generation, or the KAB crystal is used for a portion which generates the eighth-order harmonic wave as ultraviolet light from a fourth-order harmonic wave thereof according to second-order harmonic generation. Thereby, high conversion efficiency can be obtained.

In a fourth laser device of the present invention, a $Gd_xY_{1-x}Ca_4O(BO_3)_3$ crystal (i.e., a GdYCOB crystal) is used for at least one of the plurality of nonlinear optical crystals in the wavelength conversion section. The GdYCOB crystal is used, particularly for a portion which generates a fourth-order harmonic wave from a second-order harmonic wave. In this case, a value ($0 \leq x \leq 1$) of the parameter x, which represents a composition, is adjusted to adjust an index of double reflection, thereby imparting the crystal with the capability of generating a fourth-order harmonic wave according to the non-critical phase matching (NCPM). Thereby, angle deviation "walk-off" can be controlled not to occur between the fundamental wave (second-order harmonic wave) and the harmonic wave (fourth-order harmonic wave) in the nonlinear optical crystal, and therefore a generated harmonic wave maintains the same symmetry as that of the incident light. For this reason, when, for example, a seventh-order harmonic wave is generated from a fourth-order harmonic wave and a third-order harmonic wave in a subsequent stage, a high conversion efficiency can be obtained without complicated beam compensation being performed for matching the beam shapes of the two.

A fifth laser device of the present invention generates ultraviolet light and includes a laser light generator section which generates mono-wavelength laser light in a wavelength range of from an infrared region to a visible region, an optical amplifier section including an optical fiber amplifier which amplifies the laser light generated by the laser light generator section, and a plurality of relay optical systems which performs wavelength conversion for the laser light amplified by the optical amplifier section into ultraviolet light by using a plurality of nonlinear optical crystals and which relay the laser light among the plurality of nonlinear optical crystals, wherein the plurality of relay optical systems are each disposed to allow light of one wavelength to pass through.

In this case, since single-wavelength light is passed through each of the relay optical systems, chromatic-aberration compensation is facilitated, and the conversion efficiency is therefore improved. In the above-described configuration, preferably, the wavelength conversion section generates the eighth-order harmonic wave from the fundamental wave and the seventh-order harmonic wave thereof, and uses the sum frequency generation of two light beams of fundamental, second-order harmonic, fifth-order harmonic, and sixth-order harmonic waves to generate the seventh-order harmonic wave. In this case, when generating, for example, a seventh-order harmonic wave having a wavelength of 221 nm, the wavelength conversion section avoids the necessity of using a $\beta$-$BaB_2O_4$ crystal (BBO crystal), thereby improving the durability of the wavelength conversion section. On the other hand, however, when generating a seventh-order harmonic wave from third-order and fourth-order harmonic waves, the wavelength conversion section needs to use the BBO crystal which easily absorbs the seventh-order harmonic wave. In this case, a case can occur in which the durability is reduced.

A sixth-order laser device of the present invention generates ultraviolet light and includes a laser light generator section which generates a mono-wavelength laser light in a wavelength range of from an infrared region to a visible region, an optical amplifier section including an optical fiber amplifier which amplifies the laser light, and a wavelength conversion section which performs wavelength conversion for the amplified laser light into ultraviolet light having a wavelength of about 200 nm or shorter by using a plurality of nonlinear optical crystals, wherein one of lithium tetraborate and KAB crystals is used for the last stage nonlinear optical crystal of the plurality of nonlinear optical crystals which generates the ultraviolet light.

Preferably, each of the above-described laser devices is configured to further include an optical splitting section which splits the laser light generated by the laser light generator section into a plurality of laser beams, and, in this configuration, optical amplifier sections are independently provided for the plurality of split laser beams respectively, and the wavelength conversion section collects fluxes of laser beam output from the plurality of optical amplifier sections and performs wavelength conversion thereof. Thus, the laser beams split by the optical splitters are sequentially imparted with predetermined differences in optical-path lengths, and therefore, the spatial coherence of the laser beams finally bundled can be reduced. Moreover, since each of the laser beams are generated by the common laser light generator section, the spectral linewidth of the finally obtained ultraviolet light is narrow.

A seventh laser device of the present invention generates ultraviolet light and includes a laser light generator section which generates a mono-wavelength laser light in a wavelength range of from an infrared region to a visible region, an optical splitter section which splits the laser light generated by the laser generator section into a plurality of luminous fluxes, a plurality of optical amplifier sections which amplifies each of the plurality of luminous fluxes split by the optical splitter section by using optical fiber amplifiers, and a wavelength conversion section which performs wavelength conversion of laser light of a bundle of the plurality of luminous fluxes from the plurality of optical amplifier sections into ultraviolet light by using a plurality of nonlinear optical crystals, wherein the wavelength conversion section includes a nonlinear crystal which generates a harmonic wave according to sum frequency generation of a first beam composed of a fundamental wave or a harmonic wave of the laser light and a second beam composed of a harmonic wave of the laser light, and an anisotropic optical system having magnifications which are different in two directions crossing with each other to match the individual magnitudes of the plurality of luminous fluxes composing the first beam to the individual magnitudes of the plurality of luminous fluxes composing the second beam.

According to the above-mentioned present invention, the laser device can be formed to be small and to have high maintainability, and in addition, the spatial coherence of the laser beams finally bundled can be reduced. Moreover, since each of the laser beams are generated by the common laser light generator section, the spectral linewidth of the finally obtained ultraviolet light is narrow.

In addition, "walk-off" occurs because of crystal birefringence in the wavelength conversion section when angle-wise phase matching is performed through wavelength conversion. In this case, the output beam is shaped as an asymmetric ellipse. When the output beam is used as light to be incident on a subsequent nonlinear optical crystal, the beam needs to be shaped to improve the conversion efficiency. As such, an optical system having different magnifications in the longitudinal and transverse directions is used in the course of beam shaping. In an example configuration performing five-stage wavelength conversion for 193-nm generation, "walk-off" can occur in fourth-order harmonic wave generation and seventh-order harmonic wave generation. As such, the example configuration uses an optical system, such as a cylindrical lens pair, which has different magnifications in the longitudinal and transverse directions. In this case, however, while the beam shape of each of the plurality of luminous fluxes forming a bundle (bundle of the plurality of luminous fluxes) is shaped, the shape of the overall bundle is deformed according to magnifications corresponding to the magnifications in the longitudinal and transverse directions of the lens system being used.

For example, in a case where a fourth-order harmonic wave output is shaped using an optical system having different magnifications in the longitudinal and transverse directions, the beams of the fourth-order harmonic wave and the third-order harmonic wave need to be overlapped with each other in the subsequent seventh-order harmonic wave generation. Beam-overlapping for two luminous fluxes requires that the positions of individual beams in a bundle are matched, and the beams are satisfactorily overlapped with each other. When the fourth-order harmonic wave is shaped using the optical system having different magnifications in the longitudinal and transverse directions, also the overall shape of the bundle itself is deformed according to magnifications corresponding to the magnifications in the longitudinal and transverse directions of the lens systems being used. On the other hand, since the shape of the bundle of the third-order harmonic wave and the individual beam shapes are different from that of the fourth-order harmonic wave, the two need to be simultaneously tuned. As such, the magnification of the optical system for shaping the bundle and the magnification of the optical system for shaping the individual beam need to be set independently of each other. Because of the above, an anisotropic optical system having different magnifications depending on the longitudinal and transverse directions of each of the beams is concurrently used in addition to an ordinary cylindrical-lens pair or a combination of a lens and a cylindrical lens. Thereby, the ratio of an overlapped portion of the two beams is maximized, and high conversion efficiency can be obtained. Usable examples of the anisotropic optical system include a cylindrical-lens array, a prism array, and a DOE (diffractive optical element) in which fine diffraction gratings are distributed in a predetermined arrangement.

The anisotropic optical system is preferably inserted either on the optical path of the fundamental wave in the wavelength range of from an infrared region and a visible region or on an optical path of a harmonic wave of a low order (such as a third or fourth order). These wavelengths offer a high degree of freedom in optical-material selection, thereby enabling appropriate optical materials to be selectable.

Furthermore, in the present invention, the laser beam can be modulated by a light modulator and the like at a high frequency of, for example, about 100 kHz. As such, in comparison to a case where an excimer laser light (having a wavelength of several kHz) is used, the pulse energy can be reduced to about 1/1000 to 1/10000 to obtain the same illuminance. Therefore, when the above-described laser device is used as an exposure light source, transmittance variations due to, for example, compaction, can substantially be eliminated, and stable and high-accuracy exposure can be implemented.

For example, ultraviolet light substantially having the same wavelength of 193 to 194 nm as that of an ArF excimer laser can be obtained in a configuration in which a laser beam whose wavelength is limited to 1.5 µm, particularly to a range of from 1.544 to 1.552 µm is irradiated from the laser light generator section, and the eighth-order harmonic wave of the fundamental wave thereof is generated in the wavelength conversion section. Moreover, ultraviolet light substantially having the same wavelength of 157 to 158 nm as that of an $F_2$ laser can be obtained in a configuration in which a laser beam whose wavelength is limited to near 1.5 µm, particularly to a range of from 1.57 to 1.58 µm is irradiated from the laser light generator section, and the tenth-order harmonic wave of the fundamental wave thereof is generated in the wavelength conversion section. Similarly, ultraviolet light substantially having the same wavelength as that of an $F_2$ laser can be obtained in a configuration in which a laser beam whose wavelength is limited to near 1.1 µm, particularly to a range of from 1.099 to 1.106 µm is irradiated from the laser light generator section, and the seventh-order harmonic wave of the fundamental wave thereof is generated in the wavelength conversion section.

Moreover, in the exposure method of the present invention ultraviolet light from the laser device of the present invention is incident onto a mask, and a substrate is exposed with the ultraviolet light passed through a pattern of the mask. The exposure apparatus of the present invention uses the laser device of the present invention as an exposure light source, and includes an illumination system which irradiate a mask with ultraviolet light from the laser device, and a projection optical system which projects an image of a pattern of the mask onto a substrate, wherein the substrate is exposed with the ultraviolet light passed through the pattern of the mask. With the laser device of the present invention being used, the exposure apparatus can be miniaturized overall, and the maintainability thereof is increased.

Moreover, a manufacturing method of the exposure apparatus of the present invention is a method of manufacturing an exposure apparatus which illuminates the mask with the ultraviolet light, and which exposes a substrate with the ultraviolet light passed through a pattern of the mask, wherein the laser device of the present invention is used as an exposure light source, and the laser device, an illumination system which irradiates a mask with ultraviolet light from the laser device, and a projection optical system which projects an image of a pattern of the mask onto a substrate, are disposed to have a predetermined relationship.

BRIEF DESCRIPTION OF THE FIGURES IN THE DRAWINGS

FIGS. 9A and 9B are diagrams showing a still another configuration example of a wavelength conversion section 20 of the present invention.

FIGS. 10A and 10B are diagrams showing a still another configuration example of a wavelength conversion section 20 of the present invention.

BEST MODE FOR CARRYING OUT THE INVENTION

Hereinbelow, an example of a preferred embodiment according to the present invention will be described with reference to the accompanying drawings. The present example represents a configuration in which a laser device of the present invention is applied to an ultraviolet light generator that can be used as an ultraviolet-region exposure light source of a projection exposure apparatus such as a stepper or as a light source for alignment and various tests.

Figure 1:
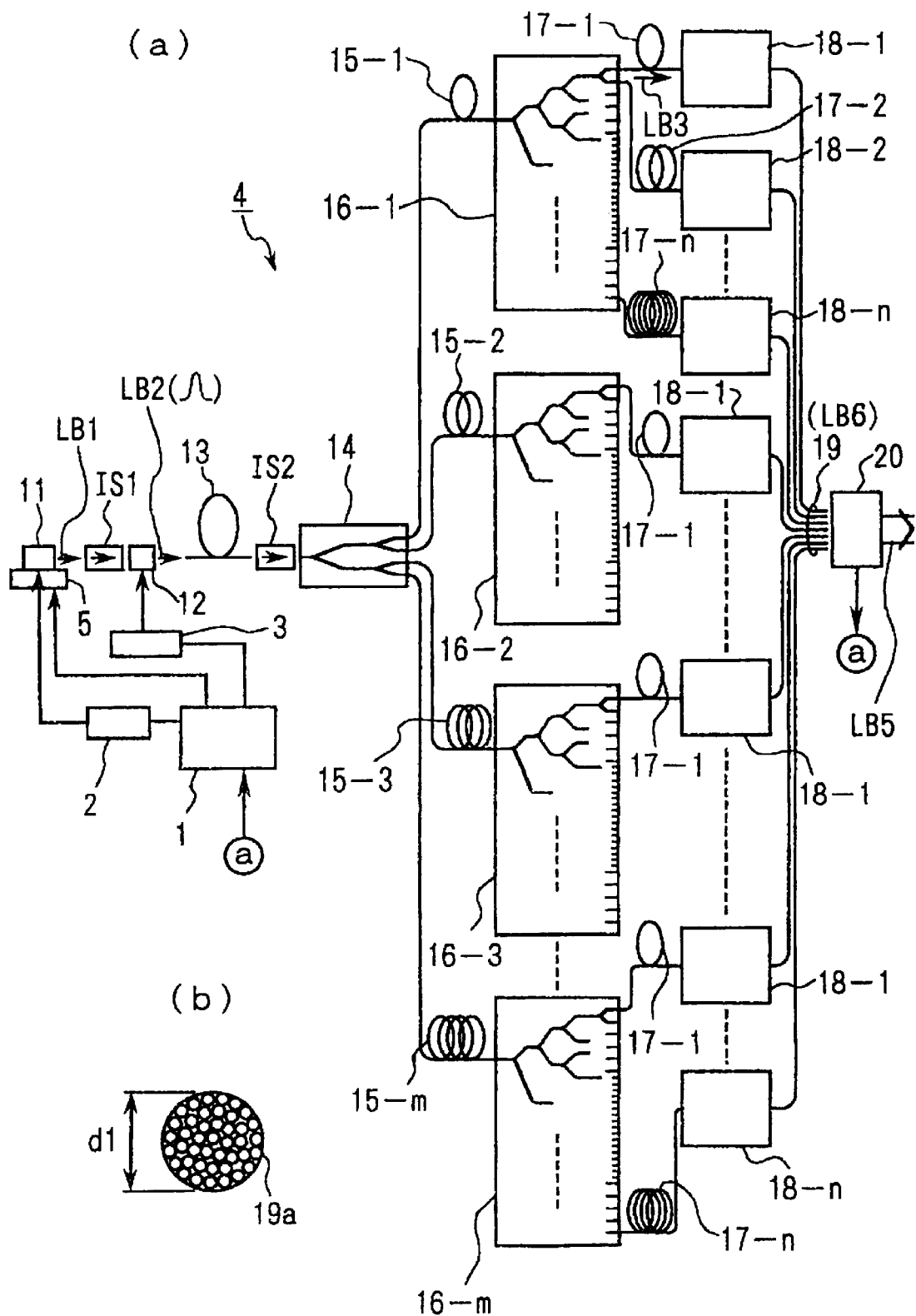
FIGS. 1A and 1B are diagrams showing an example of an ultraviolet light generator according to an embodiment of the present invention.

FIG. 1A shows an ultraviolet light generator according to the present example. Referring to FIG. 1A, a mono-wavelength oscillatory laser 11, which is provided as a laser generator section, generates a laser beam LB1 that is formed of, a continuous wave (CW) having a narrow spectral width and that has a wavelength of 1.544 µm. The laser beam LB1 is incident on an optical modulating device 12, which is provided as an optical modulator, via an isolator IS1 provided for blocking reverse light. The laser beam LB1 is converted therein into a laser beam LB2 (pulse beam), and the laser beam LB2 is then incident on an optical splitting amplifier section 4.

The laser beam LB2 incident on the optical division amplifier section 4 passes through an optical fiber amplifier 13 provided as a front-stage optical amplifier section, passes through the optical fiber amplifier 13, and is amplified therethrough. The amplified beam is then incident on a splitter 14 of a planar waveguide type provided as a first optical splitting device via an isolator IS2, and is then split into m laser beams each having the same optical intensity. The letter m represents integer "2" or a greater integer. In the present example, m=4. For the optical fiber amplifier 13, the apparatus uses an erbium-doped fiber amplifier (EDFA) to amplify light having the same wavelength zone (which is near 1.544 µm in the present example) as that of the laser beam LB1, which generated by the mono-wavelength oscillatory laser 11. An excitation beam having a wavelength of (980±10) nm or (1480±30) nm is fed into the optical fiber amplifier 13 via a coupling-dedicated wavelength division multiplexing device (not shown). In the EDFA to prevent the increase in wavelength according to nonlinear effects, the (980±10) nm laser beam is preferably used as excitation beam to thereby reduce the fiber length. The above is the same for a rear-stage optical fiber amplifier.

A (970±10) nm beam may be used as the excitation beam for either an ytterbium(Yb)-doped fiber or an erbium/ytterbium-codoped fiber.

The m laser beams that have been output from the splitter 14 are incident on planar-waveguide-type splitters 16-1, 16-2, . . . , and 16-m individually provided as second optical splitting devices via respective optical fibers 15-1, 15-2, . . . , and 15-m each having a different length. Thereby, the m laser beams are each split into n laser beams each having substantially the same optical intensity. The letter n represents "2" or a greater integer; and n=32 in the present example. The first optical splitting device (14) and the second optical splitting devices (16-1 to 16-m) correspond to optical splitters of the present embodiment according to the present invention. Consequently, the laser beam LB1 emitted from the mono-wavelength oscillatory laser 11 is split overall into n·m laser beams (that is, 128 laser beams in the present example).

N laser beams LB3 output from the splitter 16-1 are incident on optical amplifier units 18-1, 18-2, . . . , and 18-n, individually provided as rear-stage optical amplifier sections, via respective optical fibers 17-1, 17-2, . . . , and 17-n each having a different length; and the incident beams are amplified therethrough. The optical amplifier units 18-1 to 18-n each amplify a laser beam having the same wavelength zone (near 1.544 µm in the present example) as that of the laser beam LB1 generated by the mono-wavelength oscillatory laser 11. Similar to the above, n laser beams output from the other splitter 16-2 to 16-m are incident on optical amplifier units 18-1 to 18-n, individually provided as the rear-stage optical amplifier sections, via respective optical fibers 17-1 to 17-n each having a different length; and the incident beams are amplified therethrough.

The laser beams amplified by the m-group optical amplifier units 18-1 to 18-n propagate through extended portions of output terminals of optical fibers (described below) doped with a predetermined matter in the respective optical amplifier units 18-1 to 18-n. The aforementioned extended portions form a fiber bundle 19. The lengths of the m-group n optical fibers forming the fiber bundle 19 are identical to one another. However, the configuration may be such that the fiber bundle 19 is formed bundling, and the laser beams amplified by the optical amplifier units 18-1 to 18-n are transferred to the corresponding optical fibers. Thus, the optical splitting amplifier unit 4 is configured to include the members provided between the optical fiber amplifier 13 and the fiber bundle 19. The configuration of the optical splitting amplifier section 4 is not limited to that shown in FIGS. 1A and 1B. For example, a time division multiplexer may be used as an optical splitter.

Laser beams LB6 having been output from the fiber bundle 19 are incident on a wavelength conversion section 20 including a nonlinear optical device, and is converted thereby into laser beams LB5 each formed of ultraviolet light. The laser beams LB5 are output to the outside as alignment light or testing light. As described above, the m-group optical amplifier units 18-1 to 18-n are provided to individually correspond to the optical amplifier sections of the present invention. However, a case may be in which the optical fibers in the fiber bundle 19 are included in the optical amplifier sections.

Moreover, as shown in FIG. 1B, output terminals 19a of the fiber bundle 19 are bundled such that the m·n optical fibers (128 optical fibers in the present example) tightly contacts one another, and the outer shape thereof is circular in a cross-sectional view. In a practical configuration, however, the outer shape of the output terminals 19a and the number of optical fibers are determined according to, for example, the rear-stage configuration of the wavelength conversion section 20 and use conditions of the ultraviolet light generator of the present example. The clad diameter of each of the optical fibers constituting the fiber bundle 19 is about 125 µm. Accordingly, when 128 optical fibers are bundled circular, a diameter d1 of each of the output terminals 19a can be set to about 2 mm or smaller.

The wavelength conversion section 20 converts the incident laser beam LB6 to a laser beam LB5 formed of either an eighth-order harmonic wave (wavelength: 1/8) or a tenth-order harmonic wave (wavelength: 1/10). The wavelength of the laser beam LB1 output from the mono-wavelength wavelength oscillatory laser 11 is 1.544 µm. Accordingly, the wavelength of the eighth-order harmonic wave is 193 nm, which is the same as that of the ArF excimer laser; and the wavelength of the tenth-order harmonic wave is 154 nm, which is substantially the same as the wavelength (157 nm) of the $F_2$ laser (fluorine laser). Suppose a case occurs in which the wavelength of the laser beam LB5 needs to be approximated closer to the wavelength of the $F_2$ laser. This case can be achieved such that the wavelength conversion section 20 is controlled to generate a tenth-order harmonic wave, and in addition, the mono-wavelength oscillatory laser 11 is controlled to generate a laser beam having a wavelength of 1.57 µm.

In practice, ultraviolet light substantially having the same wavelength (193 to 194 nm) as that of the ArF excimer laser can be obtained in such a way that the oscillation wavelength of the mono-wavelength oscillatory laser 11 is regulated to be in a range of from 1.544 to 1.552 μm, and is converted to the eighth-order harmonic wave. Similarly, ultraviolet light substantially having the same wavelength (157 to 158 nm) as that of the $F_2$ laser in such a way that the oscillation wavelength of the mono-wavelength oscillatory laser 11 is regulated to be in a range of from 1.57 to 1.58 μm, and is converted to the tenth-order harmonic wave. As such, these ultraviolet light generators can be used as inexpensive and easily maintainable light sources in place of the ArF excimer laser source and the $F_2$ laser source.

Alternative other methods may be employed instead of the method of finally obtaining the ultraviolet light having the wavelength that is close to the wavelength zone of the ArF excimer laser or the $F_2$ laser. For example, in one of the alternative methods, an optimal exposure-light wavelength (for example, 160 nm, or the like) is determined according to patterning rules furnished for a manufacturing object such as a semiconductor device; and, for example, the oscillation wavelength of the mono-wavelength oscillatory laser 11 and the magnification of harmonic waves in the wavelength conversion section 20 are thereby determined so that ultraviolet light having a theoretically optimum wavelength can be obtained. That is, the wavelength of the light generated in the wavelength conversion section 20 may be arbitrary (for example, about 200 nm or shorter), or may be different from the eighth-order and tenth-order harmonic waves; and the configuration of the wavelength conversion section 20 may be arbitrary.

Hereinbelow, the present embodiment will be described in further detail. Referring to FIG. 1A, for the mono-wavelength oscillatory laser 11 oscillating at a single wavelength, the present example uses, a laser, such as a distributed feedback (DFB) semiconductor laser. The DFB semiconductor laser is characterized by an InGaAsP construction, a 1.544 μm oscillation wavelength, and a 20 mW continuous output (which hereinbelow will be referred to as "CW output"). In addition, the DFB semiconductor laser is configured such that, instead of a Fabry-Pelot resonator, a diffraction grating is formed in a semiconductor laser, in which single longitudinal mode oscillation is performed under any condition. Thus, since the DFB semiconductor laser performs the single longitudinal mode oscillation, the oscillation spectral linewidth can be controlled to be 0.01 pm or less. Alternatively, for the mono-wavelength oscillatory laser 11, the present example may be configured using a light source such as an erbium(Er)-doped fiber laser capable of generating a laser beam having a wavelength region similar to the above and a narrowed bandwidth.

In addition, the output wavelength of the ultraviolet light generator of the present example is preferably fixed to a specific wavelength depending on the usage. As such, the present example includes an oscillation wavelength controller provided to control the oscillation wavelength of the mono-wavelength oscillatory laser 11, provided as a master oscillator, to be a predetermined wavelength. As in the present example, in the configuration using the DFB semiconductor laser for the mono-wavelength oscillatory laser 11, the oscillation wavelength can be controlled according to a method of controlling the temperature of the DFB semiconductor laser. This method enables, for example, the oscillation wavelength to be more stably controlled to be a predetermined wavelength, and the output wavelength to be finely tuned.

Ordinarily, a component such as the DFB semiconductor laser is provided over a heatsink, and the components are stored in a package. In the present example, a temperature regulator section 5 (which is formed of, for example, a heating device such as a heater, a heat absorbing device such as a Peltier device, a temperature detecting device, and a thermistor) is fixed to a heatsink attached to the mono-wavelength oscillatory laser 11 (such as the DFB semiconductor laser). In this configuration, operation of the temperature regulator section 5 is controlled by a control section 1 comprising a computer, and the temperatures of the heatsink and the mono-wavelength oscillatory laser 11 are thereby controlled with a high accuracy. For example, the temperature in the DFB semiconductor laser can be controlled in units of 0.001° C. Moreover, the control section 1 performs high-accuracy control for power (driving current in the DFB semiconductor laser) for driving the mono-wavelength oscillatory laser 11 via a driver 2.

The oscillation wavelength of the DFB semiconductor laser has a temperature dependency of about a 0.1 nm/° C. When the temperature of the DFB semiconductor laser is changed by, for example, 1° C., the wavelength is changed by 0.1 nm in the fundamental wave (wavelength: 1544 nm). Accordingly, in the eighth-order harmonic wave (193 nm), the wavelength thereof is changed by 0.1 nm; and in the tenth-order harmonic wave (157 nm), the wavelength thereof is changed by 0.01 nm. When the laser beam LB5 is used for the exposure apparatus, compensation needs to be performed for, for example, errors that can occur according to differences in atmosphere of environments where the exposure apparatus is placed or errors that can occur because of variations in imaging properties. As such, preferably, the laser beam LB5 can preferably be varied by about ±20 pm with respect to the central wavelength. This can be implemented by changing the temperature of the DFB semiconductor laser by about ±1.6° C. for the eighth-order harmonic wave and by ±2° C. for the tenth-order harmonic wave.

For a monitor wavelength used in feedback control when controlling the above-described oscillation wavelength to be a predetermined wavelength, a wavelength that provides sensitivity necessary for desired wavelength control and that has high monitorablility may be selected from post-wavelength-conversion harmonic-wave outputs (such as a second-order harmonic wave, a third-order harmonic wave, and a fourth-order harmonic wave) in the wavelength conversion section 20 (described below). In an event a 1.51-to-1.59 μm DFB semiconductor laser is used for the mono-wavelength oscillatory laser 11, the third-order harmonic wave of the oscillation laser beam has a wavelength in a range of from 503 nm to 530 nm. This wavelength band corresponds to a wavelength zone wherein iodine-molecule absorption lines are present at a high density. As such, even higher-accuracy wavelength control can be implemented in such a way that an appropriate iodine-molecule absorption line is selected and is locked to the wavelength thereof. The present example is arranged such that a predetermined harmonic wave (preferably, the third-order harmonic wave) in the wavelength conversion section 20 is compared with the selected appropriate iodine-molecule absorption line (reference wavelength), and the differential amount of the wavelength is fed back to the control section 1. Then, based on the feedback, the control section 1 controls the temperature of the mono-wavelength oscillatory laser 11 to cause the differential amount to become a predetermined value. In this case, the control section 1 may be arranged such that the oscillation wavelength of the mono-wavelength oscillatory laser 11 is positively controlled to vary, and the output wavelength thereof can be tuned.

For example, in an exposure apparatus exposure light source to which the ultraviolet light generator of the present example is applied, the former method, described above, enables the prevention of aberration from occurring with a projection optical system because of wavelength variations. Consequently, the method avoids variations in imaging properties (optical properties such as image quality) to occur during pattern transfer.

The latter method, described above, enables compensation for variations in image properties (such as aberrations) of the projection optical system. The variations can occur because of, for example, an elevational difference and an atmospheric difference between a manufacturing site, in which the exposure apparatus is assembled and tuned, and a placement site (delivery site) of the exposure apparatus. The variations can also occur because of a difference in environments (such as inter-clean-room atmospheres). This enables reduction in time required for installation of the exposure apparatus in the delivery site. Moreover, the latter method enables compensation for variations of various types that occur during operation of the exposure apparatus. The variations include those in aberrations with an illumination optical system, in projection magnification, and focal position. These variations can occur in association with changes in reticle illumination conditions (specifically, illuminant-energy distributions of exposure illumination light on a pupillary surface of an illumination optical system) according to irradiation of exposure illumination light, atmospheric variations, and illumination optical systems. As such, the latter method enables a pattern image to be transferred on a substrate always in the best imaging condition.

The laser beam LB1, formed of continuous light output from the mono-wavelength oscillatory laser 11, is converted into the laser beam LB2, formed of a pulse beam, by use of the optical modulating device 12. The optical modulating device 12 is formed of, for example, an electrooptical modulating device or an acousto-optical modulating device. The optical modulating device 12 is driven by the control section 1 through the driver 3. Hereinbelow, a description will be made with reference to an example of the present example configuration in which the optical modulating device 12 performs the modulation into a pulse beam characterized by a pulsewidth of 1 ns and a repetition frequency of 100 kHz (pulse cycle: 10 µs). As a result of the optical modulation, the peak output power of the pulse beam produced from the optical modulating device 12 becomes 20 mW, and the average out put power thereof becomes 2 µW. In the example case, no loss is assumed to occur because of insertion of the optical modulating device 12. However, a loss of the insertion occurs in practice. For example, with a loss of −3 dB, the value of the peak output is thereby reduced to 10 mW, and the value of the average output is thereby reduced to 1 µW.

When using an electrooptical modulating device for the optical modulating device 12, the electrooptical modulating device is preferably of a type (such as a two-electrode-type modulator) that has an electrode structure subjected to chirp compensation. The aforementioned modulator is preferably used to reduce the wavelength expansion of a semiconductor-laser output, which is caused by chirp occurring according to a timewise variation in the refractive index. In addition, in the optical fiber amplifiers in the optical amplifier units 18-1 to 18-n, the amplification factor can be can be prevented from being reduced because of influence of ASE (amplified spontaneous emission) noise. The above prevention can be achieved by setting the repetition frequency to a level of 100 kHz or higher. Moreover, suppose the illuminance of ultraviolet to be finally output may be the same level as that of a conventional excimer laser beam (of which the pulse frequency is a level of several kHz). In this case, as in the present example, the pulse frequency is increased, and individual pulse beams are bundled into, for example, an aggregate of 128 delayed pulse beams. Thereby, the per-pulse energy can be reduced to a level of 1/1000 to 1/10000 to reduce variations, which can occur by compaction and the like, in refractive index of an optical member (such as a lens). For this reason, the modulator is preferably configured as described above.

Furthermore, a semiconductor laser or the like can be caused to generate output light through pulse oscillation by controlling the current of the laser. As such, the present example preferably uses the current (power) control for the mono-wavelength oscillatory laser 11 (such as the DFB semiconductor laser) and the optical modulating device 12 in association. The power control for the mono-wavelength oscillatory laser 11 is performed to oscillate a pulse beam having a pulsewidth of, for example, a level of 10 to 20 ns. Concurrently, the optical modulating device 12 is used to take out a part of the pulse beam. Thus, the present example performs modulation into a pulse beam having a pulsewidth of 1 ns.

In the above-described manner, the configuration of present example is enabled to easily generate the pulse beam with the narrower pulsewidth, in comparison to the configuration using only the optical modulating device 12. In addition, the configuration of the present invention is enabled to more easily control, for example, the pulse-beam oscillation interval, and activation and termination of the oscillation. Particularly, the associated use of the power control and the mono-wavelength oscillatory laser 11 is preferable in a case where the extinction ratio is not high enough even when only the optical modulating device 12 is used to cause the pulse beam to be in the off state.

The pulse beam output thus obtained is then coupled to the erbium-doped optical fiber amplifier 13 on the initial stage, and 35 dB (3162 times) amplification is performed thereby. At this stage, the pulse beam is amplified to have a peak output power of about 63 W and an average output power of about 6.3 mW. In the above-described configuration, a multistaged optical fiber amplifier may be used to replace the optical fiber amplifier 13.

The output of the initial-stage optical fiber amplifier 13 is first parallely split using the splitter 14 into four outputs for channels 0 to 3 (in the present example, m=4). Outputs of the respective channels 0 to 3 are then couple to the optical fibers 15-1 to 15-4 having the lengths different from one another. Thereby, delay times corresponding to the optical fiber lengths are allocated for the outputs of the optical fibers 15-1 to 15-4. For example, in the present embodiment, the propagation rate of light in each of the optical fibers is assumed to be $2 \times 10^8$ m/s. The optical fibers 15-1 to 15-4 respectively having lengths of 0.1 m, 19.3 m, 38.5 m, and 57.7 m are coupled to the channels 0, 1, 2, and 3, respectively. In this case, the delay of light between the adjacent channels at an exit terminal of each of the optical fibers is 96 ns. For the convenience of description, the optical fibers 15-1 to 15-4 thus used for delaying the light are each called a "delay fiber".

Subsequently, the outputs of the four delay fibers are further parallely split by the splitters 16-1 to 16-4 into 32 outputs (in the present example, n=32) (by each of the splitters for channels 0 to 31). That is, the outputs are split into the total of 4×32 (=128) channels. Then, the respective optical fibers 17-1 to 17-32 (delay fibers) each having a different length are coupled to output terminals of the channels 0 to 31 to allocate a 3-ns delay time between the adjacent channels. That is, a 93-ns delay time is allocated for the channel 31. On the other hand, the 96-ns delay time is allocated for the first to fourth splitters 16-1 to 16-4 at the time of input. Consequently, at output terminals of the total 128 channels provided overall, the pulse beam having the 3-ns delay time between the adjacent channels can be obtained.

As a result of the above, the spatial coherence of the laser beam LB6, which is to be output from the fiber bundle 19, is reduced on the order of 1/128, in comparison to a case where a cross-sectional shape of the laser beam LB1 to simply be output from the mono-wavelength oscillatory laser 11 is enlarged. As such, the present example exhibits an advantage in that the amount of speckles occurable when the finally obtainable laser beam LB5 is used as exposure light is very small.

As described above, according to the splitting process and the delay-time allocation, the present example enables the pulse beams having the 3-ns delay time between the adjacent channels to be obtained at the output terminals of the total 128 channels. The pulse beam observed at each of the output terminals has the same frequency of 100 kHz (pulse cycle: 10 μs) as that of the pulse beam modulated by the optical modulating device 12. Accordingly, in view of the overall laser generator section, repetition takes place at a cycle of 100 kHz such that 128 pulses are generated at 3-ns intervals, and a subsequent pulse train is then generated after an interval of 9.62 μs.

In the present embodiment, description has been made with reference to the example in which the split number is 128, and the relatively short delay fibers are used. As such, a non-emission interval of 9.62 μs occurs between the individual pulse trains. However, the pulse intervals can be completely equalized in such a way that the split numbers m and n are increased, or appropriately longer delay fibers are used, or a combination thereof is employed.

According to the above, it can be viewed that a time division multiplexing means (TDM means) is configured overall by the splitter 14, optical fibers 15-1 to 15-m, splitters 16-1 to 16-m, and m-group optical fibers 17-1 to 17-n of the present example. In the present example, the time division multiplexing means is configured of two stages of the splitters. However, the time division multiplexing means may be configured of three or more stages of splitters; or alternatively, it may be configured only of one stage of splitters while the split number is reduced. Moreover, while the splitters 14 and 16-1 to 16-m are of a planar waveguide type, the configuration may use splitters of a different type, such as fiver splitters or beam splitters using a partial transmission mirror.

In addition, the present example is capable of tuning the oscillation timing, i.e., a repetition frequency f by controlling the timing of a driving voltage pulse applied to the optical modulating device 12. Moreover, in a case where output variations can occur with the pulse beam according to a change in the oscillation timing, the arrangement may be made such that the magnitude of the driving voltage pulse, which is to be applied to the optical modulating device 12, is synchronously tuned to compensate for the output variations. In this case, the arrangement may be such that the pulse-beam output variations are compensated for only through the use of oscillation control of the mono-wavelength oscillatory laser 11 or through the associated use thereof with the above-described control of the optical modulating device 12.

Referring to FIG. 1A, the laser beams passed through the m-group delay fibers (optical fibers 17-1 to 17-n) are incident on the respective optical amplifier units 18-1 to 18-n, and are amplified thereby. The individual optical amplifier units 18-1 to 18-n of the present example have optical fiber amplifiers. While description given hereinbelow will cover example configurations of an optical amplifier unit 18 that may be used for the optical amplifier unit 18-1, the example configurations may similarly be used for the other optical amplifier units 18-2 to 18-n.

Figure 2:
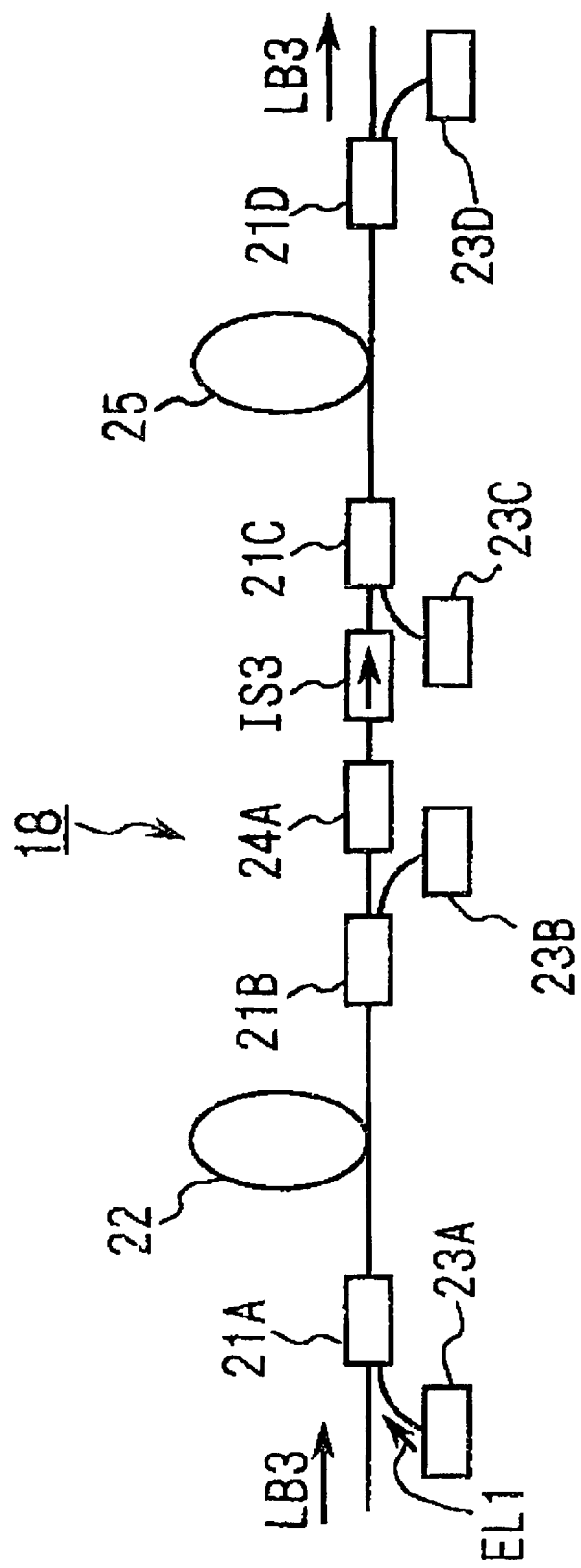
FIG. 2 is a diagram showing a configuration example of optical amplifier units 18-1 to 18-n shown in FIGS. 1A and 1B.

FIG. 2 shows an optical amplifier unit 18. Referring to FIG. 2, the optical amplifier unit 18 shown therein is basically configured to include two stages of optical fiber amplifiers 22 and 25 being coupled. The individual optical fiber amplifiers 22 and 25 are formed of erbium-doped fiber amplifiers (EDFAs). Two end portions of the first-stage optical fiber amplifier 22 are coupled to wavelength division multiplexing devices 21A and 21B (each of which hereinbelow will be referred to as a "WDM device"). The respective WDM devices 21A and 21B feed an excitation beam EL1 and another excitation beam forwardly and backwardly to the optical fiber amplifier 22. The excitation beam EL1 is fed from a semiconductor laser 23A, provided as a laser light source; and the other laser beam is fed from a semiconductor laser 23B, provided as a laser light source. Similarly, two end portions of the second-stage optical fiber amplifier 25 are coupled to coupling-dedicated WDM devices 21C and 21D. The respective WDM devices 21C and 21D forwardly and backwardly feed excitation beams, fed from semiconductor lasers 23C and 23D, to the optical fiber amplifier 25. Thus, each of the optical fiber amplifiers 22 and 25 is of a two-way excitation type.

Each of the optical fiber amplifiers 22 and 25 amplifies light having a wavelength in a range of, for example, from about 1.53 to 1.56 μm, which is inclusive of the wavelength of the incident laser beam LB3 (in the present example, the wavelength thereof is 1.544 μm). A narrow band filter 24A and an isolator IS3 for blocking reverse light are disposed in a boundary portion between the optical fiber amplifiers 22 and 25, more specifically, between the WDM devices 21B and 21C. For the narrow band filter 24A, either a multilayer film filter or a fiber bragg grating may be used.

In the present example, the laser beam LB3 from the optical fiber 17-1 shown in FIG. 1A is led via the WDM device 21A to be incident on the optical fiber amplifier 22, and is amplified thereby. Then, the laser beam LB3 amplified by the optical fiber amplifier 22 is incident on the optical fiber amplifier 25 via the WDM device 21B, the narrow band filter 24A, the isolator IS3, and WDM device 21C; and the incident laser beam LB3 is thereby amplified again. Via the WDM device 21D, the amplified laser beam LB3 propagates through one of optical fibers that constitute the fiber bundle 19 shown in FIG. 1A (the aforementioned optical fiber may be an extended portion of an output terminal of the optical fiber amplifier 25).

The total of amplification gains according to the second-stage optical fiber amplifiers 22 and 25 is 46 dB (39,810 times) as one example. When the total number of channels (m·n pieces) output from the splitters 16-1 to 16-m shown in FIG. 1B is 128, and the average output power of each of the channels is about 50 μm, the average output power of all the channels is about 6.4 mW. When a laser beam of each of the channel is amplified at about 46 dB, the average output power of the laser beam output from each of the optical amplifier units 18-1 to 18-n is about 2 W. When the above is assumed to have been pulsed at a pulsewidth of 1 ns, and a pulse frequency of 100 kHz, the peak output power of each of the laser beams is 20 kW. Also, the average output power of the laser beam Lb6 output from the fiber bundle 19 is about 256 W.

In the present example, coupling losses in the splitters 14 and 16-1 to 16-m shown in FIG. 1A are not taken into consideration. However, even when the coupling losses occur, the output powers of the laser beams of the individual channels can be unformed to be the above-described value (for example, the peak output power of 20 kW). This can be achieved by increasing at least one of the amplification gains obtained according to the optical fiber amplifiers 22 and 25 by the amount of the loss. In addition, the value of the output power (output power of the fundamental wave) of the mono-wavelength oscillatory laser 11 shown in FIG. 1A can be controlled larger or smaller than the aforementioned value. This can be achieved by controlling the amplification gains obtained according to the optical fiber amplifiers 22 and 25.

Referring to the example configuration shown in FIG. 2, the narrow band filter 24A removes ASE (amplified spontaneous emission) light occurring in each of the optical fiber amplifier 13 shown in FIG. 1A and the amplifying optical fiber 22 shown in FIG. 2, and lets the laser beam (having a wavelength in width of 1 pm or less) output from the mono-wavelength oscillatory laser 11 shown in FIG. 1A to transmit. Thereby, the narrow band filter 24A substantially makes the wavelength in width of the transmitted beam to be a narrow band. This enables the amplification gain of the laser beam to be prevented from being reduced by the incidence of the ASE light. In this case, the narrow band filter 24A preferably has a transmission wavelength in width of about 1 pm. However, since the wavelength in width of the ASE light is several tens of nm, the ASE light can be removed not to cause a problem in practice even by using a currently available narrow band filter with a transmission wavelength in width of about 100 pm.

Suppose the output wavelength of the mono-wavelength oscillatory laser 11 in FIG. 1A is positively changed. In this case, while the narrow band filter 24A may be replaced according to the output wavelength. However, preferably, a narrow band filter having a transmission wavelength in width (equivalent to a variable range (about ±20 pm, as mentioned above as an example, for an exposure apparatus) is used. Further, the isolator IS3 reduces the influence of reverse light attributed to nonlinear effects of the optical fibers. Moreover, the ASE noise is reduced. Thereby, the influences of SRS (stimulated raman scattering) and SBS (stimulated brillouin scattering), which are nonlinear effects other than those of the last-stage optical fiber amplifier 25, are also reduced. Consequently, the wavelength in width expansion is mitigated. The optical amplifier unit 18 may be configured by coupling three or more stages of optical fiber amplifiers. Also in this case, the narrow band filter 24A and the isolator IS3 are preferably inserted into the boundary portion between the two adjacent optical fiber amplifiers in the overall configuration.

In the present example, since a large number of the output beams of optical amplifier unit 18 are bundled and are used in the bundled state, the intensities of the individual output beams are preferably homogenized. This can be implemented in, for example, the following manner. A part of the laser beam LB3 output from the WDM device 21D is isolated, the isolated light is photoelectrically converted, and the luminous quantities of laser beams LB3 to be output are thereby monitored. Then, outputs of excitation light sources (semiconductor lasers 23A to 23D) in each of the optical amplifier units 18 are controlled so that the aforementioned luminous quantities are substantially equal to one another in all the optical amplifier units 18.

In the above-described embodiment, the laser light source having an oscillation wavelength of about 1.544 µm is used for the mono-wavelength oscillatory laser 11. Instead of this laser light source, however, the embodiment may use a laser light source having an oscillation wavelength in a range of from 1.099 to 1.106 µm. For this laser light source, either a DFB semiconductor laser or an ytterbium(Yb)-doped fiber laser may be used. In this case, for the optical fiber amplifier in the rear-stage optical amplifier section, the configuration may use an ytterbium(Yb)-doped fiber amplifier (YDFA) that performs amplification in a wavelength zone of 990 to 1200 nm including the wavelength of the amplifier section. In this case, ultraviolet light having a wavelength of 157 to 158 nm wave that is substantially the same wavelength of the $F_2$ laser can be obtained by outputting the seventh-order harmonic wave in the wavelength conversion section 20 shown in FIG. 1B. In practice, ultraviolet light having substantially the same wavelength as that of the $F_2$ laser can be obtained by controlling the oscillation wavelength to be about 1.1 µm.

Moreover, the arrangement may be made such that the fourth-order harmonic wave of the fundamental wave is output in the wavelength conversion section 20 by controlling the oscillation wavelength in the mono-wavelength oscillatory laser 11 to be near 990 nm. This enables ultraviolet light having a same wavelength of 248 nm as that of the KrF excimer laser to be obtained.

In the last-stage high-peak-output optical fiber amplifier (for example, the optical fiber amplifier 25 shown in FIG. 2), according to above-described present embodiment, it is preferable to use a large mode diameter fiber having a fiber mode diameter of, for example, 20 to 30 µm, which is larger than that is ordinarily used (5 to 6 µm), to avoid the increase in the spectral width according to the nonlinear effects in the fiber.

Moreover, a double clad fiber having a double clad structure may be used in place of the large mode diameter fiber to obtain a high level output in the last-stage optical fiber amplifier (for example, optical fiber amplifier 25 shown in FIG. 2). In this optical fiber, a core portion is doped with ion that contributes to amplification of laser light, and the amplified laser light propagates through the inside of the core. An excitation-dedicated semiconductor laser is coupled to the first clad that covers the core. The first clad serves in a multimode and has a large cross section. As such, the high-output excitation-dedicated semiconductor laser beam can easily be transmitted therethrough, a multimode-oscillation semiconductor laser can be efficiently coupled, and hence, the excitation-dedicated light source can efficiently be used. A second clad for forming a waveguide of the first clad is formed on the circumference of the first clad.

A quarts fiber or a silicate-based fiber may be used for the optical fiber amplifier of the above-described embodiment. Alternatively, a fluoride-based fiber, such as a ZBLAN fiber, may be used. With the fluoride-based fiber, in comparison to the quartz or silicate-based fiber, a relatively high erbium dope concentration can be obtained, thereby enabling the fiber length necessary for amplification can be reduced. Particularly, the fluoride-based fiber is preferably used for the last-stage optical fiber amplifier (optical fiber amplifier 25 shown in FIG. 2). The reduced fiber length enables mitigation in the wavelength-in-width expansion due to the nonlinear effects during pulse-beam propagation through the fiber. In addition, the reduced fiber length enables the provision of a narrow-band wavelength in width necessary for, for example, the exposure apparatus. The narrow-band light source offers an advantage, particularly when it is used in an exposure apparatus that has a large number of openings. For example, the light source is advantageous in the design and manufacture of the projection optical system.

In addition, an optical fiber mainly using phosphate glass or oxidized-bismuth based glass ($Bi_2O_3B_2O_3$) may be used, particularly for the last-stage optical fiber amplifier. With the phosphate-glass optical fiber, the core can be doped at a high concentration with a rare-earth based element(s) (such as erbium (Er), or both the erbium (Er) and ytterbium (Yb)). In this case, in comparison to the conventional silicate glass, the fiber length necessary to obtain the same optical amplification factor is about 1/100 of that with the conventional silica glass. With the oxidized-bismuth based glass optical fiber, in comparison to the conventional silica glass, the amount of doped erbium (Er) can be increased to be 100 or more times of that with the conventional silica glass. In this case, effects similar to those with the phosphate glass can be obtained.

In a case where a wavelength of 1.51 to 1.59 µm is used for the output wavelength of the optical fiber amplifier having the double-structure clads, the fiber core is co-doped with erbium (Er) and ytterbium (Yb) used together as an ion dopant. The co-doping is advantageous to improve the semiconductor-laser excitation efficiency. That is, when the erbium/ytterbium co-doping is performed, high-ytterbium-absorbing wavelength expands near a region of 915 to 975 nm. By using the wavelength near to aforementioned region, the plurality of semiconductor lasers each having a unique oscillation wavelength are connected through wavelength division multiplexing (WDM) and coupled to the first clad. As a result, the plurality of semiconductor lasers can be used as excitation beams, and a high excitation intensity can therefore be implemented.

In designing the doped fiber used in the optical fiber amplifier, a material is preferably selected to obtain a high gain of the optical fiber amplifier in a desired wavelength for an apparatus (such as an exposure apparatus) as in the present example that operates at a predetermined wavelength. For example, a material enabling a high gain to be obtained with desired wavelength, for example 1.548 µm, is preferably selected for an amplifying fiber used in an ultraviolet laser apparatus designed to obtain the same output wavelength (193 to 194 nm) as that of the ArF excimer laser.

However, for wavelength-division-multiplexed communication, a communication fiber is designed to have a relatively stable gain in a wavelength region of several tenth of nm near 1.55 µm. As such, for a communication fiber including, for example, erbium-monodoped core as an excitation medium, a method of co-doping a silica fiber with aluminum, phosphorous, and the like is used to implement the stable gain. As such, with the fiber of this type, the gain is not always increased at 1.548 µm. Aluminum as a dopant element has the effect of shifting the peak near 1.55 µm, and phosphorous has the effect of shifting the peak to a short wavelength side. As such, a small amount of phosphorous can be used as a dopant to increase the gain in a region near 1.547 µm. Similarly, a small amount of phosphorous can be used as a dopant to increase the gain in a region near 1.547 µm to be even higher when using the optical amplifying fiber (such as the double-clad type fiber) having the core doped (co-doped) with both erbium and ytterbium.

Hereinbelow, a description will be made regarding example configurations of the wavelength conversion section 20 used in the ultraviolet light generator of the embodiment shown in FIGS. 1A and 1B.

Figure 3:
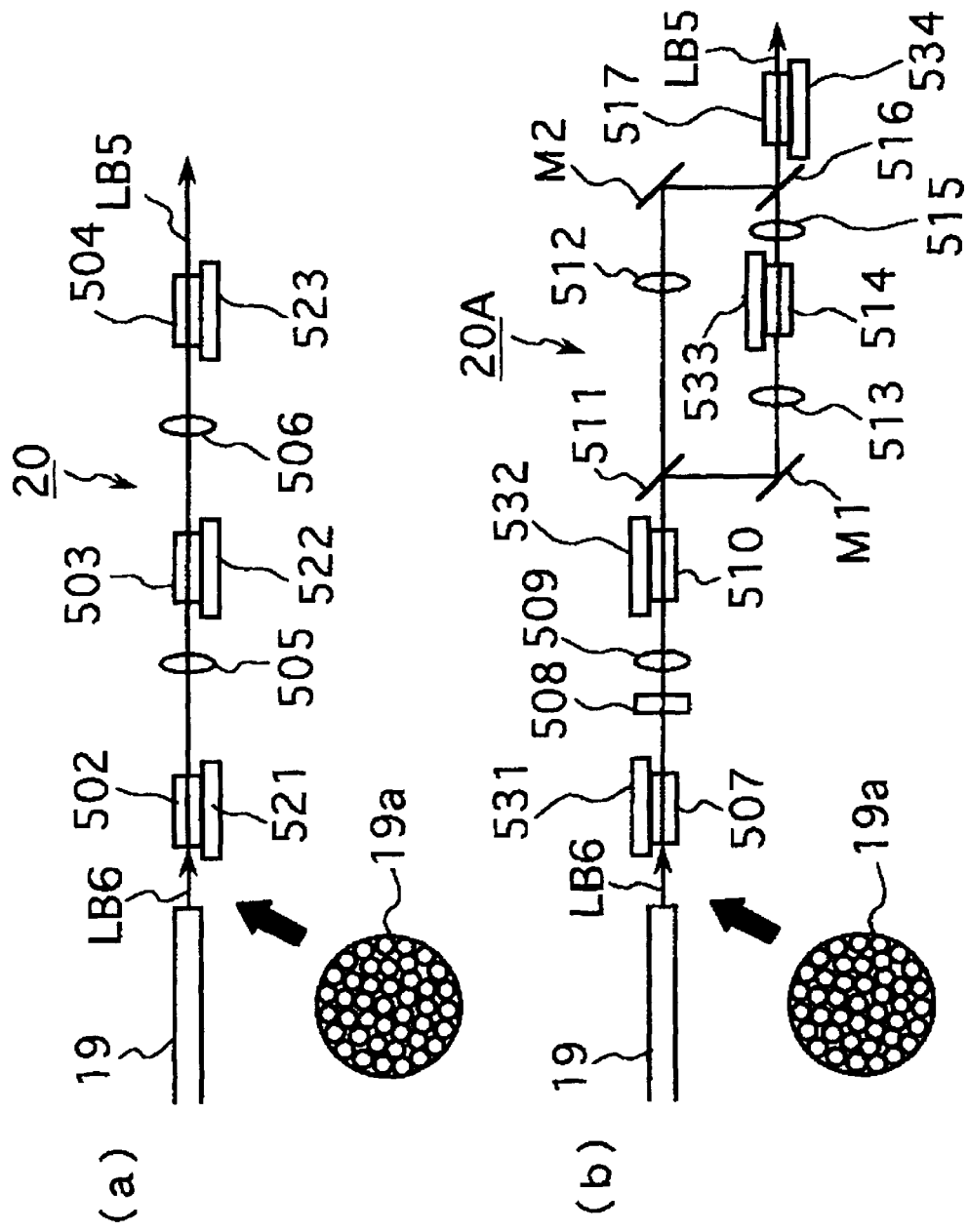
FIG. 3A is a diagram showing a first configuration example of a wavelength conversion section 20 shown in FIGS. 1A and 1B.
FIG. 3B is a diagram showing a second configuration example of the wavelength conversion section 20.

FIG. 3A shows the wavelength conversion section 20 that is capable of obtaining the eighth-order harmonic wave through repetition of the second-order harmonic wave generation. In FIG. 3A, an output terminal 19a of an optical fiber bundle 19 is, as shown being enlarged, made up of such as 128 optical fibers which are bundled into about 2 mm or smaller circular shape. From the mode portion (core portion) having a diameter of about 20 µm in the each optical fibers, is emitted laser beams each having a wavelength of 1.544 µm (the frequency is represented by "ω") with a predetermined open angle (numerical aperture), and light bundled with these laser beams forms a laser beam LB6 as a whole.

The laser beam LB6 (fundamental wave) is incident on a first-stage nonlinear optical crystal 502. The second-order harmonic wave generation is performed therein to generate the second-order harmonic wave having a twofold frequency 2• (wavelength: 1/2 of 772 nm) of the fundamental wave. The generated second-order harmonic wave is then incident on a second-stage nonlinear optical crystal 503 through a converging lens 505. Similar to the above, through the second-order harmonic wave generation, there is generated fourth-order harmonic wave having a twofold frequency of the frequency 2ω0 of the incident wave, that is, a fourfold frequency 4ω (wavelength: 1/4 of 386 nm) with respect to the fundamental wave. The generated fourth-order harmonic wave is then transferred to a third-stage nonlinear optical crystal 504 through a converging lens 506. Similarly, through the second-order harmonic wave generation, there is generated eighth-order harmonic wave having a twofold frequency of the frequency 4ω of the incident wave, that is, an eightfold frequency 8ω (wavelength: 1/8 of 193 nm) with respect to the fundamental wave. The eighth-order harmonic wave is output as laser beam LB5. Thus, the example configuration performs wavelength modulations in the following order: fundamental wave (wavelength: 1.544 µm)→second-order harmonic wave (wavelength: 772 nm)→fourth-order harmonic wave (wavelength: 386 nm)→eighth-order harmonic wave (wavelength: 193 nm).

Nonlinear optical crystals usable for the above-described wavelength conversion include, for example, a $LiB_3O_5$ (LBO) crystal for the nonlinear optical crystal 502 used to convert the fundamental wave into the second-order harmonic wave, a GdYCOB, that is, a $Gd_xY_{1-x}Ca_4O(BO_3)_3$ crystal ($0 \leq x \leq 1$), for the nonlinear optical crystal 503 used to convert the second-order harmonic wave into the fourth-order harmonic wave, and a KAB, that is, a $K_2Al_2B_4O_7$ crystal for the nonlinear optical crystal 504 used to convert the fourth-order harmonic wave into the eight-order harmonic wave.

In this case, the GdYCOB crystal of the present example is made, by adjusting a value of the parameter x which determines a composition, to be a crystal having an index of double reflection which allows generating a fourth-order harmonic wave from a second-order harmonic wave by a non-critical phase matching (NCPM). The NCPM method does not cause an angular displacement (so-called "walk-off") between the fundamental wave (second-order harmonic wave) and a harmonic wave (fourth-order harmonic wave) in the nonlinear optical crystal, thereby allowing conversion into the fourth-order harmonic wave with high efficiency. As such, the NCPM method is advantageous in that the generated fourth-order harmonic wave is not influenced by walk-off-caused beam deformation.

Further, since the KAB crystal is used at a portion which generates the eighth-order harmonic wave from the fourth-order harmonic wave, high conversion efficiency can be obtained.

In addition, in the present example, temperature controllers 521, 522 and 523 are attached to all nonlinear optical crystals 502, 503 and 504, respectively. The temperature controllers 521 to 523 each include a heating device (such as a heater), a heat sink (such as a Peltier device), and a thermal measuring device (such as a thermistor). The temperature controllers 521 to 523 control the temperatures of the respective nonlinear optical crystals 502, 503 and 504 to be target temperatures according to control information received from a control section (not shown). According to the temperature control, final finetuning of the phase matching angle for wavelength conversion is performed through the aforementioned NCPM (non-critical phase matching). Walk-off in each of the stages is highly mitigated, and the conversion efficiency is thereby maintained high according to the temperature control performed to finely tune the phase matching angles of all the nonlinear optical crystals 502 to 504 in the wavelength conversion section 20.

When the conversion efficiency is allowed to decrease somewhat, the second-stage nonlinear optical crystal 503 may be formed of an LBO crystal. Alternatively, the third-stage nonlinear optical crystal 504 may be formed of an SBBO crystal ($Sr_2Be_2B_2O_7$ crystal).

Referring to FIG. 3A, a converging lens, which is effective for improving the incidence efficiency of laser beam LB6, is preferably provided between the fiber bundle 19 and the nonlinear optical crystal 502. In this case, each of the optical fibers constituting the fiber bundle 19 has a mode diameter (core diameter) of about 20 μm, and a region where the conversion efficiency in the nonlinear optical crystal has a size of about 200 μm. As such, a lens with a very low magnification of about 10× magnification may be provided in units of the optical fiber to converge the laser beam output from each of the optical fibers into the nonlinear optical crystal 502. This applies also to other example configurations described below.

FIG. 3B shows a wavelength conversion section 20A that is capable of obtaining the eighth-order harmonic wave by combining the second harmonic wave generation and sum frequency generation. Referring to FIG. 3B, the laser beam LB6 (fundamental wave) having a wavelength of 1.544 μm output from the output terminal 19a of the fiber bundle 19 is incident on a first-stage nonlinear optical crystal 507 formed of the LBO crystal. In the crystal 507, there is generated the second-order harmonic wave according to the second harmonic wave generation. In addition, a part of the fundamental wave is transmitted as is through the nonlinear optical crystal 507. Both the fundamental wave and second-order harmonic wave in a linearly polarized state are transmitted trough a wavelength plate 508 (for example, a 1/2 wavelength plate), and only the fundamental wave is output in a 90-degree rotated direction of polarization. The fundamental wave and the second-order harmonic wave individually pass through a converging lens 509 and are incident on a second-stage nonlinear optical crystal 510 formed of the LBO crystal.

In the nonlinear optical crystal 510, there is generated the third-order harmonic wave from the second-order harmonic wave generated in the nonlinear optical crystal 507 and the fundamental wave transmitted without being converted. The above generation is performed according to the aforementioned sum frequency generation. The third-order harmonic wave generated in the nonlinear optical crystal 510 and the second-order harmonic wave transmitted without being converted are isolated by a dichroic mirror 511. Then, the third-order harmonic wave reflected by the dichroic mirror 511 is transmitted through a converging lens 513 to be incident on a third-stage nonlinear optical crystal 514 formed of a GDYCOB crystal. Therein, the third-order harmonic wave is converted by the second-order harmonic wave generation into the sixth-order harmonic wave (wavelength: 257 nm). A value of the parameter x which determines a composition of the nonlinear optical crystal 514 is adjusted, so that it generates a sixth-order harmonic wave according to non-critical critical phase matching (NCPM). Thereby, "walk-off" scarcely occurs.

The second-order harmonic wave transmitted through the dichroic mirror 511 is incident on a dichroic mirror 516 via a converging lens 512 and a mirror M2. In addition, the sixth-order harmonic wave obtained through the nonlinear optical crystal 514 is incident on the dichroic mirror 516 via a converging lens 515. In this step, the second-order harmonic wave and the sixth-order harmonic wave are coaxially combined, and a composition thereof is incident on a fourth-stage nonlinear optical crystal 517 formed of βP-$BaB_2O_4$ crystal (BBO crystal). In the nonlinear optical crystal 517, there is generated the eighth-order harmonic wave (wavelength: 193 nm). The eighth-order harmonic wave is output as an ultraviolet laser beam LB5. A $CsLiB_6O_{10}$ (CLBO) crystal may be used in place of the BBO crystal for the nonlinear optical crystal 517. In addition, when the conversion efficiency is allowed to decrease somewhat, a BBO crystal may be used for the nonlinear optical crystal 514. Thus, the wavelength conversion section 20A performs wavelength conversion in the following order: fundamental wave (wavelength: 1.544 μm)→second-order harmonic wave (wavelength: 772 nm)→third-order harmonic wave (wavelength: 515 nm)→sixth-order harmonic wave (wavelength: 257 nm)→eighth-order harmonic wave (wavelength: 193 nm).

Also in the present example, temperature controllers 531 to 534 are attached to all nonlinear optical crystals 507, 510, 514, and 517, respectively, to control the temperatures of the respective nonlinear optical crystals; and the phase matching angles are individually finely tuned through the temperature control. In this case, the temperatures of the nonlinear optical crystals 507 and 510 are set to be different from each other.

As described above, the present example has the configuration in which one of the sixth-order harmonic wave and second-order harmonic wave passes through a split optical path and is then incident on the fourth-stage nonlinear optical crystal 517. In the configuration, the converging lenses 515 and 512 individually converging the sixth-order harmonic wave and the second-order harmonic wave into the fourth-stage nonlinear optical crystal 517 can be disposed on optical paths different from each other. In this case, even if "walk-off" narrowly occurs in the third-stage nonlinear optical crystal 514, and the output sixth-order harmonic wave has an elliptical cross section, as in the present example, by disposing the individual converging lenses 515 and 512 on different optical paths, for example, a cylindrical lens pair can be used for the converging lens 515, thereby enabling the beam-shaping for the sixth-order harmonic wave to easily be implemented. Hence, the conversion efficiency can be improved by increasing overlapping portions with the second-order harmonic wave in the fourth-stage nonlinear optical crystal 517.

The configuration between the second-stage nonlinear optical crystal 510 and the fourth-stage nonlinear optical crystal 517 is not limited to that shown in FIG. 3B. This configuration may be arbitrarily arranged as long as it has the same optical path lengths for the sixth-order harmonic wave and the second harmonic wave to cause the sixth-order harmonic wave and the second harmonic wave to be incident on the fourth-stage nonlinear optical crystal 517. Moreover, for example, the third-stage and fourth-stage nonlinear optical crystals 514 and 517 may be disposed on the same optical axis of the second-stage nonlinear optical crystal 510. In this configuration, the third-stage nonlinear optical crystal 514 is used to convert only the third-order harmonic wave into the sixth-order harmonic wave according to the second-order harmonic wave generation, and the converted harmonic wave and the non-converted second-order harmonic wave together may be incident on the fourth-stage nonlinear optical crystal 517. This configuration avoids the necessity of using the dichroic mirrors 511 and 516.

Figure 4:
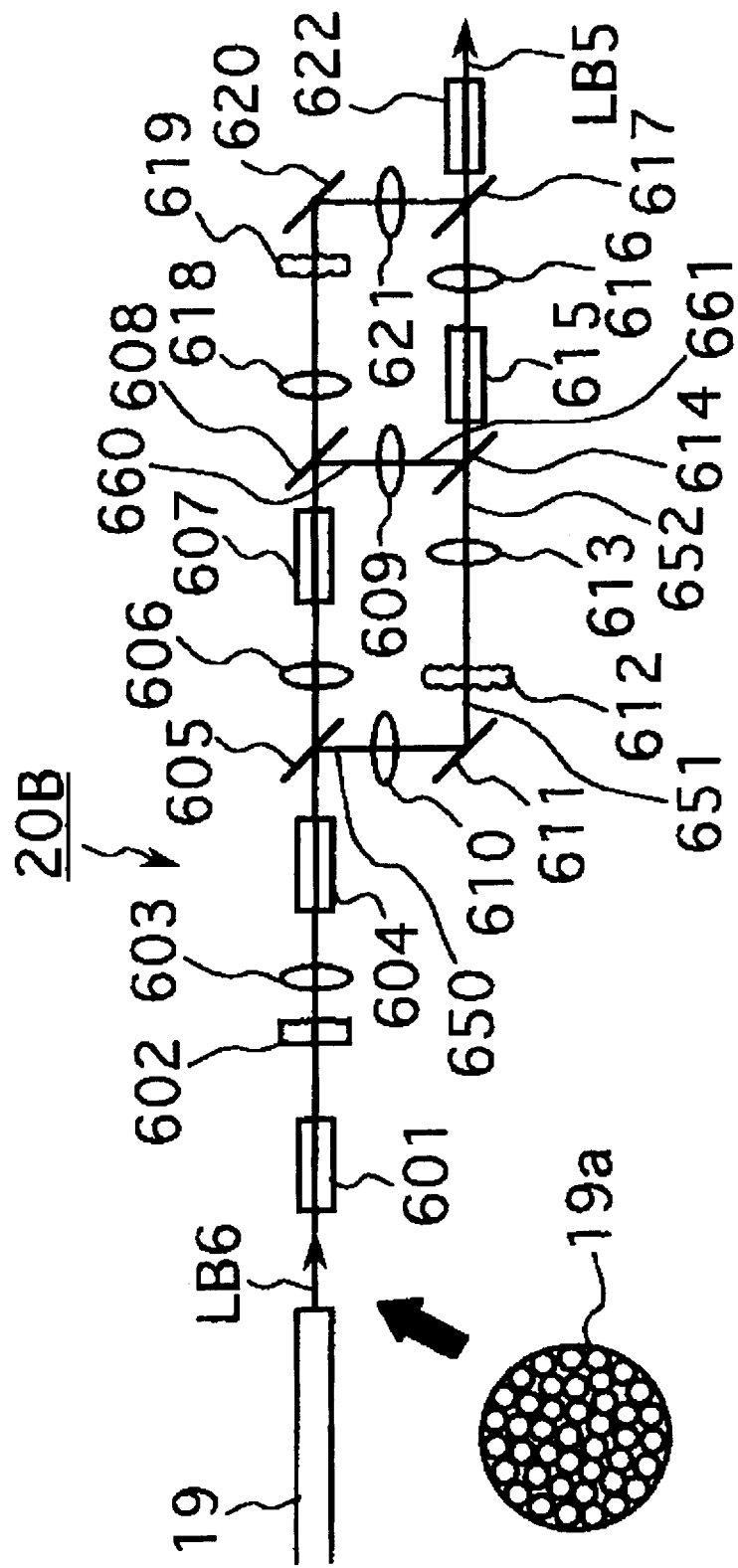
FIG. 4 is a diagram showing a third configuration example of the wavelength conversion section 20.

Next, FIG. 4 shows another wavelength conversion section 20B that enables the eighth-order harmonic wave to be generated through combination of the second harmonic wave generation and the sum frequency generation. Referring to FIG. 4, the laser beam LB6 (fundamental wave), having a wavelength of 1.544 µm, which has been output from the output terminal 19a of the fiber bundle 19, is incident on a first-stage nonlinear optical crystal (LBO crystal) 601, in which a second-order harmonic wave is generated according to the second-order harmonic wave generation. In addition, a part of the fundamental wave is transmitted as it is therethrough. In this case, an image of the output terminal 19a (images of a large number of thin luminous fluxes) is formed near a center of the nonlinear optical crystal 601 by a converging lens (not shown). The images of the large number of the luminous fluxes are relayed successively into the succeeding nonlinear optical crystal.

Both the fundamental wave and second-order harmonic wave transmit in a linearly polarized state through a wavelength plate 602 (such as a 1/2 wavelength plate), and only the fundamental wave is output with its direction polarization being rotated 90-degree. The fundamental wave and the second-order harmonic wave individually pass through a converging lens 603, and are incident on a second-stage nonlinear optical crystal (LBO crystal) 604.

In the nonlinear optical crystal 604, a third-order harmonic wave is obtained from an incident second-order harmonic wave and a fundamental wave, and a part of the fundamental wave and a part of the second-order harmonic wave are transmitted without being converted in wavelength. The third-order harmonic wave, which has been obtained through the second-stage nonlinear optical crystal 604, and the second-order harmonic wave, which has transmitted without wavelength conversion, are isolated by a dichroic mirror 605. The third-order harmonic wave reflected by the dichroic mirror 605 forms an image of an output terminal 19a (image of a large number of luminous fluxes) through an anisotropic converging lens 610, formed of two cylindrical lens, and a mirror 611. A cylindrical-lens array 612 is disposed near a formed plane of the aforementioned image to convert the image of the individual luminous fluxes at an image having magnifications that are different in two directions perpendicular to each other. The third-order harmonic wave transmitted through the cylindrical-lens array 612 passes through an isotropic converging lens 613 and is then incident on a dichroic mirror 614.

On the other hand, the fundamental wave and the second-order harmonic wave, which have transmitted through the dichroic mirror 605, passes through a converging lens 606 and is then incident on a third nonlinear optical crystal 607 (LBO crystal). Through the third nonlinear optical crystal 607, the second-order harmonic wave is converted into a fourth-order harmonic wave according to second-order harmonic generation. Then, the fourth-order harmonic wave and the fundamental wave transmitted without being converted are isolated by a dichroic mirror 608 from each other. Specifically, the fourth-order harmonic wave reflected by the dichroic mirror 608 is incident on the dichroic mirror 614 through an anisotropic converging lens 609 formed of two cylindrical lenses. Then, the third-order harmonic wave and the fourth-order harmonic wave that have coaxially been combined through a dichroic mirror 614 are incident on a fourth-stage nonlinear optical crystal 615 formed of a β-BaB$_2$O$_4$ crystal (BBO crystal). Thereby, a seventh-order harmonic wave is obtained therefrom according to sum frequency generation. The seventh-order harmonic wave is then incident on a dichroic mirror 617 through a converging lens 616.

The fundamental wave transmitted through the dichroic mirror 608 then forms an image of the output terminal 19a (image of a large number of the luminous fluxes) through an anisotropic converging lens 618 formed of two cylindrical lens. A cylindrical-lens array 619 is disposed near a formed plane of the aforementioned image to convert the image of the individual luminous fluxes at an image having magnifications that are different in two directions perpendicular to each other. The fundamental wave transmitted through the cylindrical-lens array 619 then transmits through a mirror 620 and an isotropic converging lens 621, and is then incident on the dichroic mirror 617. The seventh-order harmonic wave and the fundamental wave that have coaxially been combined through the dichroic mirror 617 are incident on a fifth-stage nonlinear optical crystal 622 formed of an LB4 crystal, namely, an Li$_2$B$_4$O$_7$ (lithium tetraborate) crystal. Therein, an eighth-order harmonic wave (wavelength: 193 nm) is obtained according to sum frequency generation. The eighth-order harmonic wave is then output as a laser beam LB5 in the form of ultraviolet light. For the fifth-stage nonlinear optical crystal 622, a KAB crystal (K$_2$Al$_2$B$_4$O$_7$ crystal) may be used to replace the LB4 crystal. The wavelength conversion section 20B performs wavelength conversion in the order: fundamental wave (wavelength: 1.544 µm) second-order harmonic wave (wavelength: 772 nm)→third-order harmonic wave (wavelength: 515 nm)→fourth-order harmonic wave (wavelength: 386 nm)→seventh-order harmonic wave (wavelength: 221 nm)→eighth-order harmonic wave (wavelength: 193 nm).

Figure 5:
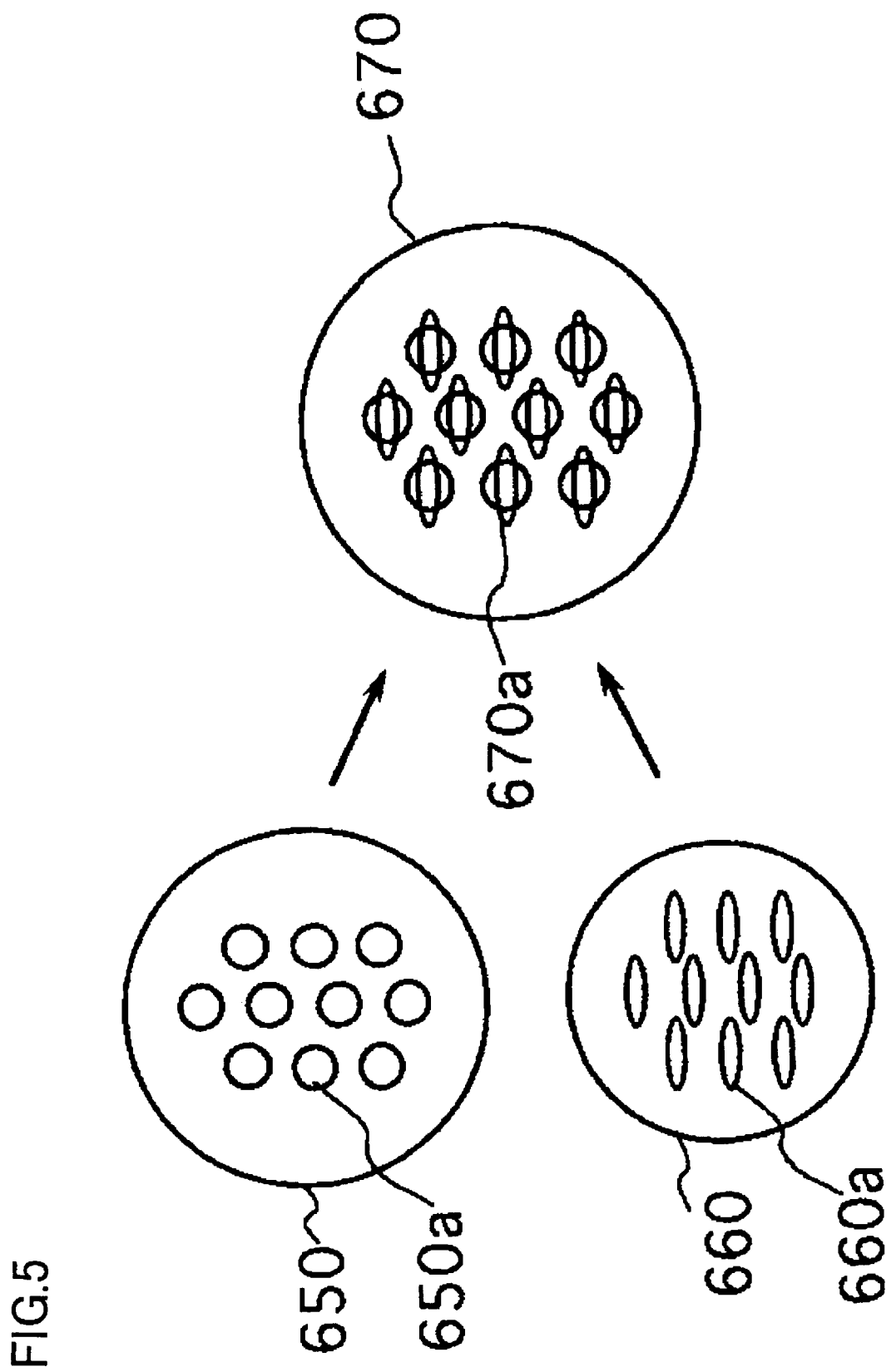
FIG. 5 is a diagram showing a state where a third-order harmonic wave and a fourth-order harmonic wave overlap with each other in a configuration not using an anisotropic converging lens in FIG. 4.

In the present example, the fourth-order harmonic wave, generated through the nonlinear optical crystal 607 according to the second harmonic generation, and the seventh-order harmonic wave, generated through the nonlinear optical crystal 615 according to the sum frequency generation, are each deformed to be ellipse (anisotropic) in a cross-sectional view because of the walk-off phenomenon. However, a laser beam LB6 to be incident in the present example is an aggregate of a large number of thin luminous fluxes (128 fluxes in the present example) each having a predetermined opening, the cross-sectional shapes of the large number of luminous fluxes forming the fourth-order harmonic wave and the seventh-order harmonic wave are discretely deformed to be anisotropic. As such, a fourth-order harmonic wave 660 generated by the nonlinear optical crystal 607 and a third-order harmonic wave 650 generated by the nonlinear optical crystal 604 that are shown in FIG. 4 individually have cross-sectional shapes as shown in FIG. 5. Specifically, the fourth-order harmonic wave 660 is an aggregate of luminous fluxes 660a each having an elliptical cross-sectional shape, and the third-order harmonic wave 650 is an aggregate of luminous fluxes 650a each having a circular cross-sectional shape. Consequently, when the third-order harmonic wave 650 and the fourth-order harmonic wave 660 are simply overlapped to form a composite wave 670, the ratio of an overlapped portion in each luminous flux 670a forming the composite wave 670 is so small as to cause the conversion efficiency to decrease.

Figure 6:
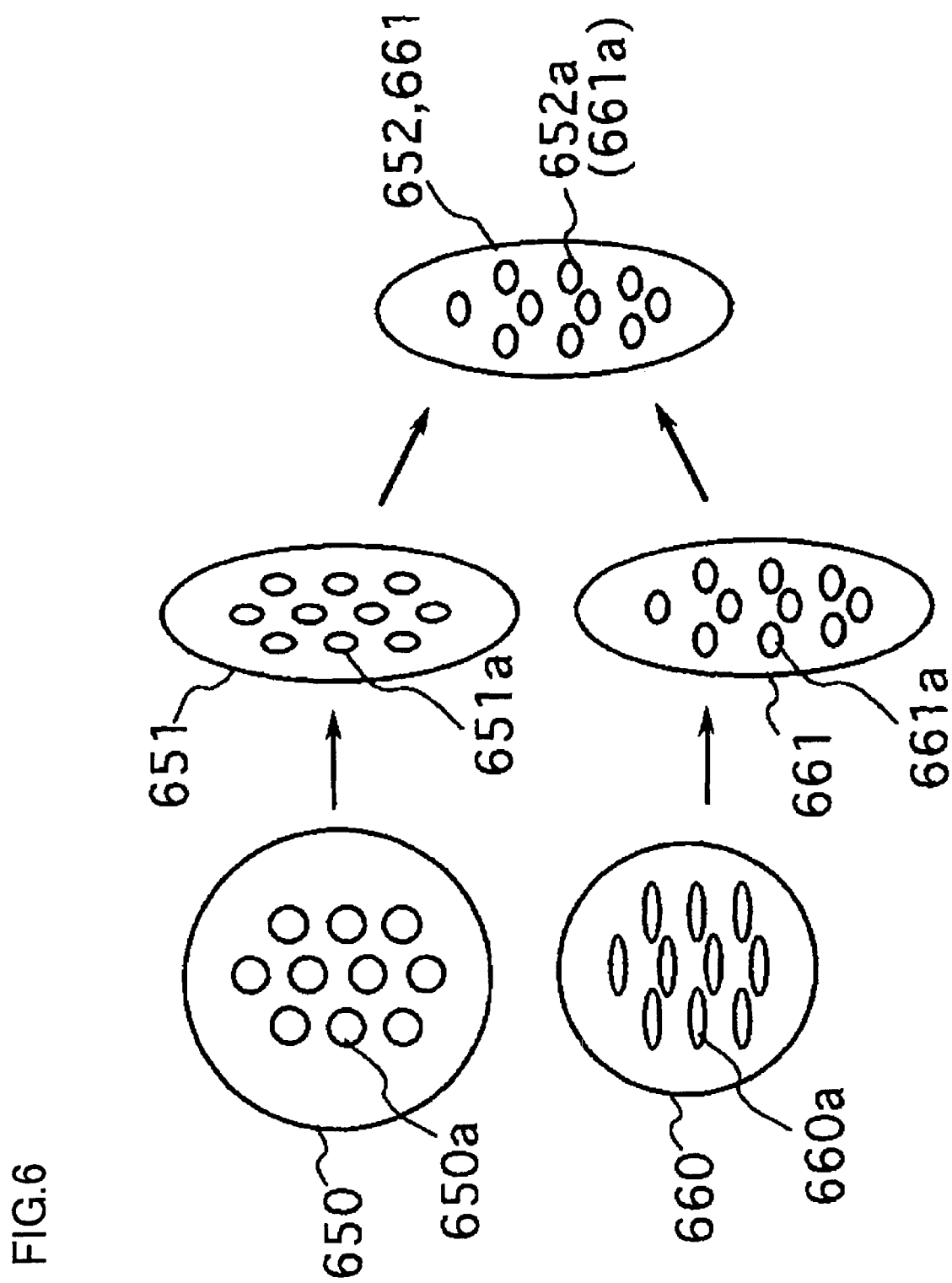
FIG. 6 is a diagram showing a state where the third-order harmonic wave and the fourth-order harmonic wave overlap with each other in a wavelength conversion section shown in FIG. 4.

To increase the ratio of the overlapped portion in the composite wave, the present example is arranged such that the fourth-order harmonic wave 660 shown in FIG. 4 is first longitudinally reduced and is thereby converted into a fourth-order harmonic wave 661 formed of luminous fluxes 661a each having a substantially circular cross-sectional shape as shown in FIG. 6. In the figures, the fourth-order harmonic wave 660 represents the shape in a state of having been imaged through the nonlinear optical crystal 607. The fourth-order harmonic wave 661 represents the shape in a state of having been imaged through the nonlinear optical crystal 615. Concurrently, the third-order harmonic wave 650 shown in FIG. 4 is reduced through the anisotropic converging lens 610 in the same direction as that for the fourth-order harmonic wave 660 to thereby obtain a uniformed overall cross-sectional shape. Consequently, as shown in FIG. 6, while a third-order harmonic wave 651 thus obtained has the same overall cross-sectional shape as that of the fourth-order harmonic wave 661, the shape of each luminous flux 651a is formed elliptical, and the ratio of a portion overlapping with the luminous flux 661a is reduced. In the figures, the third-order harmonic wave 650 represents the shape in a state of having been imaged through the nonlinear optical crystal 604. The third-order harmonic wave 651 represents the shape in a state of having been imaged through the anisotropic converging lens 610.

In the state illustrated in FIG. 4, to increase the ratio of the overlapped portion, the cylindrical-lens array 612 is used to convert the cross-sectional shape of each of the luminous fluxes to substantially be circular. A third-order harmonic wave 652 thus obtained, as shown in FIG. 6, is uniformed in overall cross-sectional shape with the fourth-order harmonic wave 661. In addition, each of the luminous flux 651a is uniformed in cross-sectional shape with the luminous flux 661a of the fourth-order harmonic wave 661. In addition, since the converging lens 613 is isotropic, the third-order harmonic wave 652 is relayed to the nonlinear optical crystal 615 at the same aspect ratio at the incident time. As a result, the seventh-order harmonic wave is generated at the highest conversion efficiency in the nonlinear optical crystal 615.

In addition, also a large number of luminous fluxes forming the seventh-order harmonic wave generated by the nonlinear optical crystal 615 are formed elliptical. As such, in the last stage of nonlinear optical crystal 622, to uniform the overall cross-sectional shapes of the seventh-order harmonic wave and the fundamental wave and to uniform cross-sectional shapes of the individual luminous fluxes, the fundamental wave transmitted through the nonlinear optical crystal 607 is once imaged through the anisotropic converging lens 618. Thereafter, an image of each of the luminous fluxes is deformed through the cylindrical-lens array 619. Thereby, the eighth-order harmonic wave is generated by the nonlinear optical crystal 622 at the highest conversion efficiency.

Moreover, referring to FIG. 4, the cylindrical-lens arrays 612 and 619 are respectively disposed on the optical path of the third-order harmonic wave (wavelength: 515 nm) and the optical path of the fundamental wave (wavelength: 1.544 μm). Many types of materials for transmitting the substantially visible and infrared light are available. As such, the manufacture of the cylindrical-lens arrays 612 and 619 is facilitated.

In the above-described embodiment, the cylindrical-lens arrays 612 and 619 are each used as an anisotropic optical system having different magnifications in the crossing two directions. However, the embodiment may instead use one of a microlens array and a diffractive optical element (DOE). In this case, the microlens array is formed of the same number of anisotropic lens as that of the luminous fluxes which forms the incident laser beam. Concurrently, the diffractive optical element is formed of an aggregate of the same number of fine diffraction gratings as that of the aforementioned luminous fluxes.

For each of the wavelength conversion sections 20 and 20A shown in FIGS. 3A and 3B, per-channel average output power of the eighth-order harmonic wave (wavelength: 193 nm) was estimated. From the result, it was verified that when the per-channel incident laser beam is characterized by a peak power of 20 kW, a pulsewidth of 1 ns, a pulse repetition frequency of 100 kHz, and an average output power of 2W, any one of the wavelength conversion sections 20, 20A, and 20B was verified to be capable of providing ultraviolet light having a wavelength of 193 nm, which is sufficient output as an exposure apparatus-dedicated exposure light source, in the overall configuration including 128 channels.

A configuration similar to the wavelength conversion section 20, 20A, 20B can be arranged to perform the wavelength conversion in the following order: fundamental wave (wavelength: 1.544 μm)→second-order harmonic wave (wavelength: 772 nm)→fourth-order harmonic wave (wavelength: 386 nm)→sixth-order harmonic wave (wavelength: 257 nm)→eighth-order harmonic wave (wavelength: 193 nm). Furthermore, the eighth-order harmonic wave can be obtained through the wavelength conversion performed in the following order: fundamental wave (wavelength: 1.544 μm)→second-order harmonic wave (wavelength: 772 nm)→third-order harmonic wave (wavelength: 515 nm)→fourth-order harmonic wave (wavelength: 386 nm)→sixth-order harmonic wave (wavelength: 257 nm)→seventh-order harmonic wave (wavelength: 221 nm)→eighth-order harmonic wave (wavelength: 193 nm). It is preferable to select one of the above configurations that has a relatively high conversion efficiency and that can be simplified.

To have ultraviolet light having substantially the same wavelength as that of the $F_2$ laser (wavelength: 157 nm), as the wavelength conversion section 20, the configuration may be arranged to use a wavelength conversion section capable of generating the tenth-order harmonic wave with 1.57 μm wavelength of the fundamental wave generated in the mono-wavelength oscillatory laser 11 shown in FIG. 1A. To implement the above, for example, the wavelength conversion may be performed in the following order: fundamental wave (wavelength: 1.57 μm)→second-order harmonic wave (wavelength: 785 nm)→fourth-order harmonic wave (wavelength: 392.5 nm)→eighth-order harmonic wave (wavelength: 196.25 nm)→tenth-order harmonic wave (wavelength: 157 nm).

In addition, a different method may be employed to obtain ultraviolet light having substantially the same wavelength as the wavelength (157 nm) of the $F_2$ laser. A method can be envisaged that uses a wavelength conversion section as the wavelength conversion section 20, which is capable of generating the seventh-order harmonic wave with the 1.099-μm wavelength of the fundamental wave generated in the mono-wavelength oscillatory laser 11. In this case, for example, the wavelength conversion may preferably be performed in the following order: fundamental wave (wavelength: 1.099 μm)→second-order harmonic wave (wavelength: 549.5 nm)→third-order harmonic wave (wavelength: 366.3 nm)→fourth-order harmonic wave (wavelength: 274.8 nm)→seventh-order harmonic wave (wavelength: 157 nm). Also in these cases, high conversion efficiency can be obtained by appropriately employing a configuration similar to that of the embodiment shown in FIGS. 3A and 3B or FIG. 4.

Figure 8:
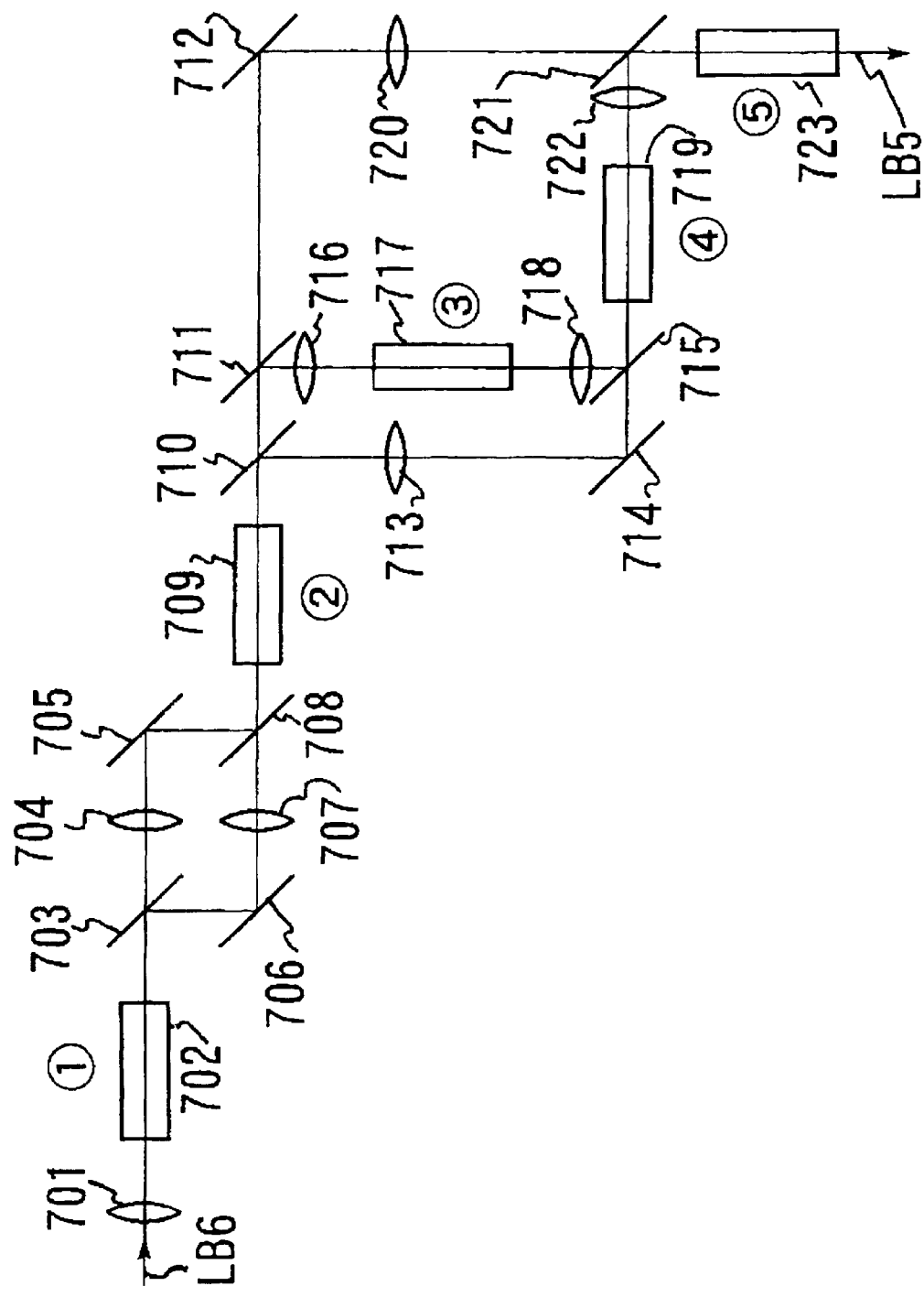
FIG. 8 is a diagram showing another configuration example of a wavelength conversion section 20 of the present invention.

FIG. 8 shows another example configuration of the wavelength conversion section 20. Referring to FIG. 8, a laser beam LB6 (fundamental wave) having a wavelength of 1.544 μm is incident on a nonlinear optical crystal 702 (LBO crystal) via a lens 701, a second-order harmonic wave of the fundamental wave is generated therethrough, and also a part of the fundamental wave transmits therethrough. The fundamental wave and the second-order harmonic wave are isolated by a dichroic mirror 703 from each other. The fundamental wave is incident on a dichroic mirror 708 through a mirror 706 and a lens 707, and the second-order harmonic wave is incident on the dichroic mirror 708 through a mirror 705. The light combined through the dichroic mirror 708 generates a third-order harmonic wave in a nonlinear optical crystal 709 (LBO crystal). The fundamental wave, the second-order harmonic wave, and the third-order harmonic wave also pass through the nonlinear optical crystal 709.

The fundamental wave is led to a dichroic mirror 721 through the dichroic mirrors 710 and 711 and a mirror 712. The second-order harmonic wave is led to pass through a lens 716 and is then converted into a fourth-order harmonic wave through a nonlinear optical crystal 717 (formed of, for example, one of the LBO, CLBO, BBO, and LB4 or the like). Thereafter, the converted fourth-order harmonic wave is incident on a nonlinear optical crystal 719 (BBO crystal) through a lens 718 and a dichroic mirror 715. The third-order harmonic wave is incident on a nonlinear optical crystal 719 through a lens 713, a mirror 714, and the dichroic mirror 715. Therethrough, a seventh-order harmonic wave is generated from the third-order harmonic wave and the fourth-order harmonic wave according to the sum frequency generation. The seventh-order harmonic wave is led to the dichroic mirror 721 through a lens 722. The fundamental wave and the seventh-order harmonic wave combined through the dichroic mirror 721 are converted into an eighth-order harmonic wave (wavelength: 193 nm) through a nonlinear optical crystal 723 (formed of, for example, LBO, BBO, CLBO, or KAB). The eighth-order harmonic wave is output as a laser beam LB5 in the form of ultraviolet light. The wavelength conversion section performs wavelength conversion in the following order: fundamental wave (wavelength: 1.544 μm)→second-order harmonic wave→third-order harmonic wave→fourth-order harmonic wave→seventh-order harmonic wave→eighth-order harmonic wave (wavelength: 193 nm).

In the present example, in each of, for example, the lenses 701, 704, 707, and 713 are used to pass the mono-wavelength light. Hence, no chromatic aberrations occur with the lenses, and the conversion efficiency can thereby be improved.

FIG. 9A shows another example configuration of the wavelength conversion section 20. Referring to FIG. 9A, a laser beam LB6 (fundamental wave) having a wavelength of 1.544 μm is incident on a nonlinear optical crystal 802 (LBO crystal) via a lens 801, a second-order harmonic wave is generated therethrough, and also a part of the fundamental wave transmits therethrough. The fundamental wave and the second-order harmonic wave are isolated by a dichroic mirror 803 from each other. The fundamental wave is incident on a dichroic mirror 808 through a mirror 806 and a lens 807, and the second-order harmonic wave is incident on the dichroic mirror 808 through a mirror 805. The light combined through the dichroic mirror 808 generates a third-order harmonic wave in a nonlinear optical crystal 809 (LBO crystal); and the fundamental wave, the second-order harmonic wave, and the third-order harmonic wave passes through the nonlinear optical crystal 809.

The fundamental wave is led to a dichroic mirror 816 through the dichroic mirrors 810, 813 and a mirror 814. The second-order harmonic wave is led to pass through the dichroic mirror 810, a lens 811, a mirror 812, and a dichroic mirror 818 and is then incident on a nonlinear optical crystal 819 (formed of, for example, one of LBO, CLBO, BBO, and LB4). The third-order harmonic wave passes through the dichroic mirrors 810 and 813, a lens 817, and the dichroic mirror 818, and is then incident on the nonlinear optical crystal 819. A fifth-order harmonic wave is generated in the nonlinear optical crystal 819, and a part of the second-order harmonic wave is transmitted therethrough without being converted. Then, the second-order harmonic wave is incident on a nonlinear optical crystal 826 (formed of one of CLBO and BBO) through a dichroic mirror 820, a lens 821, a mirror 822, and a dichroic mirror 825. The fifth-order harmonic is incident on a nonlinear optical crystal 826 through the dichroic mirror 820, a mirror 823, a lens 824, and the dichroic mirror 825. Therethrough, a seventh-order harmonic wave is generated from the second-order harmonic wave and the fifth-order harmonic wave according to the sum frequency generation. The seventh-order harmonic wave is led to the dichroic mirror 816 through a mirror 827 and a lens 828. The fundamental wave and the seventh-order harmonic wave combined through the dichroic mirror 816 are converted into an eighth-order harmonic wave (wavelength: 193 nm) through a nonlinear optical crystal 829 (formed of, for example, LBO, CLBO, or KAB or the like). The eighth-order harmonic wave is output as a laser beam LB5 in the form of ultraviolet light. The wavelength conversion section performs wavelength conversion in the following order: fundamental wave (wavelength: 1.544 μm)→second-order harmonic wave→third-order harmonic wave→fifth-order harmonic→wave seventh-order harmonic wave→eighth-order harmonic wave (wavelength: 193 nm).

As a result, since the seventh-order harmonic wave need not be generated according to the sum frequency generation, BBO having absorption with the seventh-order harmonic wave (wavelength: 221 nm) need not be used. Hence, the durability is improved, and in addition, the phase-matching tolerance is increased. With a sixth-order harmonic wave (258 nm) or a fifth-order harmonic wave (309 nm), the absorption by BBO is sufficiently less in comparison to the seventh-order harmonic wave. As such, even with BBO being used, a high durability can be obtained. In addition, since the absorption of a fifth-order harmonic wave by BBO is less than that of a sixth-order harmonic wave, the BBO is preferably used for generating the fifth-order harmonic wave. In addition, the eighth-order harmonic wave (193 nm) can be generated without the BBO.

Also in an example shown in FIG. 9A, for example, the individual lenses 801, 804, 807, and 817 or the like are used to pass through the mono-wavelength light, no chromatic aberrations occur with the lenses. Hence, the conversion efficiency can be improved.

An example configuration shown in FIG. 9B performs wavelength conversion in the following order: fundamental wave (wavelength: 1.544 μm)→second-order harmonic wave→third-order harmonic wave→sixth-order harmonic wave→seventh-order harmonic wave→eighth-order harmonic wave (wavelength: 193 nm). A nonlinear optical crystal 832 for the second-order harmonic wave generation (ω+ω→2ω) is formed of LBO; a nonlinear optical crystal 839 for the third-order harmonic wave generation (ω+2ω→3ω) is formed of LBO; a nonlinear optical crystal 841 for the sixth-order harmonic wave generation (3ω+3ω→6ω) is formed of one of BBO, LB4, and CLBO; a nonlinear optical crystal 847 for the seventh-order harmonic wave generation (ω+6ω→7ω) is formed of one of LBO and LB4 (BBO is also usable); and a nonlinear optical crystal 854 for the eighth-order harmonic wave generation (ω+7ω→8ω) is formed of one of, for example, LBO, CLBO, and KAB. In addition, in the configuration, there are disposed lenses 831, 836, 837, 842, 845, 852, and 850; mirrors 834, 835, 843, 844, 851, and 849; and dichroic mirrors 833, 838, 840, 846, 848, and 853.

Similarly, an example configuration shown in FIG. 10A performs wavelength conversion in the following order: fundamental wave (wavelength: 1.544 μm)→second-order harmonic wave→fourth-order harmonic wave→fifth-order harmonic wave→seventh-order harmonic wave→eighth-order harmonic wave (wavelength: 193 nm). A nonlinear optical crystal 902 for the second-order harmonic wave generation (ω+ω→2ω) is formed of LBO; a nonlinear optical crystal 906 for the fourth-order harmonic wave generation (2ω+2ω=4ω) is formed of one of LBO and YCOB; a nonlinear optical crystal 912 for the fifth-order harmonic wave generation (ω+4ω→5ω) is formed of one of LBO, CLBO, BBO and LB4; a nonlinear optical crystal 921 for the seventh-order harmonic wave generation (2ω+5ω→7ω) is formed of CLBO (BBO is also usable); and a nonlinear optical crystal 920 for the eighth-order harmonic wave generation (ω+7ω→8ω) is formed of one of, for example, LBO, CLBO, and KAB or the like. In addition, in the configuration, there are disposed lenses 901, 905, 907, 910, 913, 915, 923, and 918; mirrors 904, 909, and 917; and dichroic mirrors 903, 908, 911, 914, 916, and 919.

Similarly, an example configuration shown in FIG. 10B performs wavelength conversion in the following order: fundamental wave (wavelength: 1.544 pm)→second-order harmonic wave→fourth-order harmonic wave→sixth-order harmonic wave→seventh-order harmonic wave→eighth-order harmonic wave (wavelength: 193 nm). A nonlinear optical crystal 932 for the second-order harmonic wave generation (ω+ω→2ω) is formed of LBO; a nonlinear optical crystal 935 for the fourth-order harmonic wave generation (2ω+2ω4ω) is formed of one of LBO and YCOB; a nonlinear optical crystal 942 for the sixth-order harmonic wave generation (2ω+4ω→6ω) is formed of one of CLBO, BBO and LB4; a nonlinear optical crystal 921 for the seventh-order harmonic wave generation (ω+6ω→7ω) is formed of one of CBO and LB4 (BBO is also usable); and a nonlinear optical crystal 954 for the eighth-order harmonic wave generation (ω+7ω→8ω) is formed of one of, for example, LBO, CLBO, and KAB or the like. In addition, in the configuration, there are disposed lenses 931, 934, 938, 940, 943, 946, 952, and 949; mirrors 945, 937, 939, 951, and 950; and dichroic mirrors 936, 941, 944, 948, and 950.

In either of the example configurations shown in FIGS. 9A, 9B, 10A and 10B, no lens chromatic aberration occurs. Moreover, the seventh-order harmonic wave is generated without third-order and fourth-order harmonic waves.

As is apparent from FIG. 1A, in the above-described embodiment, the combined light of the outputs of the n optical amplifier units 18-1 to 18-n in the m-group is converted in wavelength by using the single wavelength conversion section 20 to 20B. Alternatively, however, the configuration may be arranged such that, for example, m' units (m'="2" or larger inger) wavelength conversion sections are provided. In the alternative configuration, the outputs of the m-group optical amplifier units 18-1 to 18-n are divided in units of n' outputs into m' groups, the wavelength conversion is performed for one of the wavelength conversion section in units of one of the groups, and the obtained m' ultraviolet light beams (in the present example, m'="4", "5", or the like) are combined. Thus, the wavelength conversion section 20 is not limited to that having the above-described configuration. Moreover, for example, a CBO crystal ($CsB_3O_5$), may be used as an alternative crystal for the nonlinear optical crystal.

According to the ultraviolet light generator of the above-described embodiment, the diameter of the output terminal of the fiber bundle 19, shown in FIG. 1A, even with all the channels being included, is about 2 mm or smaller. As such, one or several units of the wavelength conversion sections 20 are sufficient to perform the wavelength conversion of all the channels. In addition, since flexible optical fibers are used for the output terminals, the flexibility in configuration is very high. For example, the configuration sections such as the wavelength conversion section, the mono-wavelength oscillatory laser, and the splitter, can be separately disposed. Consequently, the ultraviolet light generator of the present example enables the provision of an ultraviolet laser device that is inexpensive and compact, and has a low spatial coherence while it is of a mono-wavelength type.

Hereinbelow, an example exposure apparatus using the ultraviolet light generator shown in FIG. 1A will be described.

Figure 7:
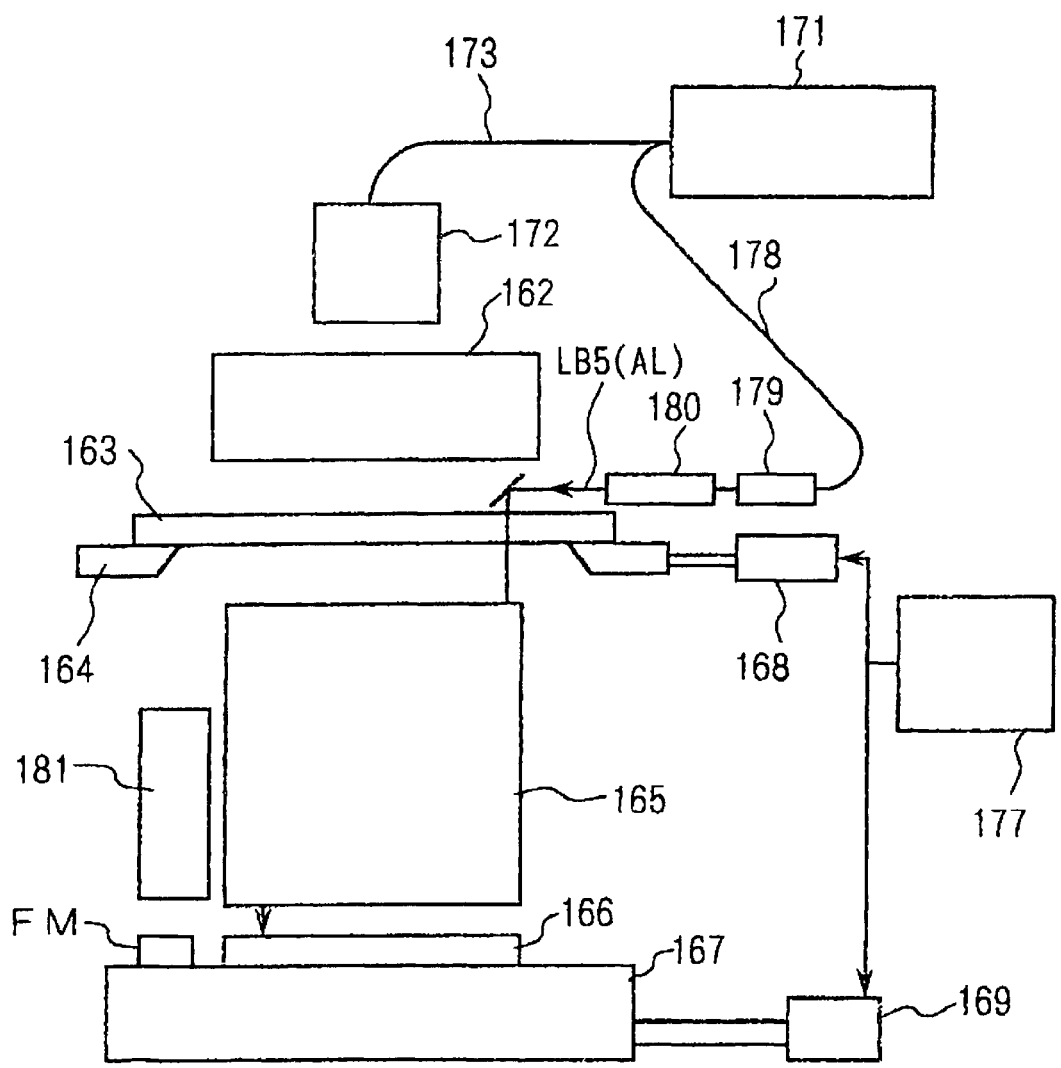
FIG. 7 is a configuration view showing a projection exposure apparatus including an example of an ultraviolet light generator of the embodiment of the present invention.

FIG. 7 shows an exposure apparatus of the present example. Referring to FIG. 7, component members provided between the mono-wavelength oscillatory laser 11 and the m-group optical amplifier units 18-1 to 18-n in the ultraviolet light generator shown in FIG. 1A are used for an exposure light source 171. The ultraviolet light generator is tuned to be capable of converting the laser beam LB5 finally output into light in an ultraviolet region with one of wavelengths of 193 nm, 157 nm, and others.

Most of a laser beam (fundamental wave) output from a light-source mainbody section 171 is fed to an illumination system 162 via a coupling-dedicated optical fiber 173 and a wavelength conversion section 172. The rest of the laser beam is fed to an alignment system (described below in detail) via a coupling-dedicated optical fiber 178. The coupling-dedicated optical fibers 173 and 178 individually correspond to beams obtained by splitting the light in a fiber bundle 19 shown in FIG. 1A.

The wavelength conversion section 172 (which corresponds to the wavelength conversion section 20 shown in FIG. 1A) converts the wavelength of the fundamental wave received from a light-source mainbody section 171, and outputs ultraviolet-region exposure light formed of the laser beam LBS. The illumination system 162 is configured of, for example, an optical integrator (homogenizer) for homogenizing illuminance distributions of the exposure light, an aperture diaphragm, a field diaphragm (reticle blind), and a condenser lens. In the aforementioned configuration, the exposure light output from the illumination system 162 illuminates a slit-like illumination region of a pattern surface of a reticle 163 set as a mask to provide a homogeneous illuminance distribution. In the present example, since the spatial coherence of the exposure light is so low that the configuration of a member for reducing the spatial coherence in the illumination system 162 can be simplified, and the exposure apparatus can therefore be further miniaturized.

The reticle 163 is set on a reticle stage 164. The exposure light transmitted through the reticle 163 is used to project a demagnified image of a pattern in the illumination region onto a wafer 166 (exposure-target substrate) via a projection optical system 165. The projection is performed at a magnification $M_{RW}$ (for example, 1/4, 1/5, 1/6, or the like). For the projection optical system 165, any one of a dioptric system, a reflection system, or a catadioptric system is usable. However, when using vacuum ultraviolet light for the exposure light, since materials having high transmittance is limited, the catadioptric system may preferably used to improve the imaging performance. The wafer 166 is coated with photoresist, and is a disc-like substrate, such as a semiconductor (silicon or the like) or a SOI (silicon on insulator).

The wafer 166 is held on a wafer stage 167, and the three-dimensional position of the wafer 166 is defined by the wafer stage 167 driven by a drive section 169. In addition, the reticle stage 164 is driven by a driving mechanism 168 to be two-dimensionally movable and rotatable. The driving section 169 and the driving mechanism 168 are controlled by a primary control system 177. At the time of exposure, under the control of the primary control system 177, the wafer 166 is positioned through stepping movements of the wafer stage 167. Thereafter, the reticle 163 is scanned via the reticle stage 164 in a predetermined direction with respect to the illumination region, and the image of the pattern of the reticle 163 is transferred on each shot region of the wafer 166 according to step-and-scan method. In this case, the step-and-scan method performs scanning the wafer 166 via the wafer stage 167 by using the magnification $M_{RW}$ as a velocity ratio. Thus, the exposure apparatus of the present example is of a scan-exposure type. However, it should be apparent that the exposure light source 171 can be applied also to an exposure apparatus, such as a stepper, of a full-field-exposure type.

In the above-described case, since the exposure light source 171 and the wavelength conversion section 172 (light-source system) of the present example are small, it may be immobilized together with at least a portion (such as the wavelength conversion section 172) of the light-source system on a frame provided for supporting the illumination system 162. Alternatively, the exposure light source 171 may be independently disposed. However, a powersupply and the like to be coupled to the exposure light source 161 are preferably disposed separately.

As described above, the exposure apparatus using the ultraviolet light generator of the present example is smaller in comparison with the conventional one using another type (exposure apparatus using, for example, the excimer laser or the arrayed laser). In addition, since the exposure apparatus is configured of elements coupled using the optical fibers, the exposure apparatus has a high flexibility in disposition of the individual units used for the configuration thereof.

Exposure-light-amount control in the above-described scan-exposure operation may be implemented in the following manner. Control is performed for at least one of the pulse repetition frequency f, which is defined by the optical modulating device 12 shown in FIG. 1A, and the interchannel delay time, which is defined by the delaying devices (optical fibers 15-1 to 15-m, and 17-1 to 17-n). The control is thus performed to cause the exposure light source 171 to oscillate a plurality of pulse beams at equal time intervals during scan-exposure operation. In addition, according to the sensitivity property of the photoresist, at least one of the optical intensity of the pulse beam on the wafer 166, the scan speed for the wafer 166, the pulse-beam oscillation interval (frequency), and the width of the pulse beam in the scan direction for the wafer 166 (that is, an radiation region thereof) to thereby control the integrated luminous quantity of a plurality of pulse beams irradiated in a period in which the individual points of the wafer traverse the radiation region. At this time, in consideration of the throughput, least one of other control parameters representing the pulse-beam optical intensity, the oscillation frequency, and the radiation region width is preferably controlled so that the scan speed for the wafer 166 is substantially maintained to be the maximum speed of the wafer stage 167.

In addition, in the present example, since the coupling-dedicated optical fiber 173 and a coupling-dedicated optical fiber 178 are used, the light-source mainbody section 171 can be provided outside of the exposure apparatus mainbody. The configuration built as described above enables major configuration portions involving heat generation to be disposed outside of the exposure apparatus mainbody. The major configuration portions include an excitation-dedicated semiconductor laser for the optical fiber amplifier, a driving powersupply for the semiconductor laser, and a temperature controller. As such, the configuration enables the mitigation or avoidance of heat-attributed problems, such as a problem of optical-axis misalignment that can occur when the exposure apparatus mainbody is influenced by heat generated in the ultraviolet light generator provided as the exposure light source.

In addition, the reticle stage 164 of the present example is configured so that it is driven by the driving mechanism 168 to be movable in the X and Y directions and to be finely rotatable. Further, a reference mark plate FM is provided on the wafer stage 167. The reference mark plate FM is used for, for example, baseline measurement described below. Moreover, the present example includes an alignment system 180 provided for detecting an alignment mark on the reticle 163, and an alignment system 181 of an off-access method that operates without the projection optical system 165.

In the present example, a laser beam (fundamental wave) from the light-source mainbody section 171 is fed to a wavelength conversion section 179 for the alignment system 180 via an optical fiber 178. For the wavelength conversion section 179, the present example uses a wavelength conversion section that is similar to the wavelength conversion section 20 shown in FIG. 1A and that is relatively small. The wavelength conversion section 179 is integrally provided on the frame that holds the alignment system 180, in which laser beam LB5 having the same wavelength as that of the exposure light that has been output from the wavelength conversion section 179 is used as illumination light AL.

The above-described arrangement avoids the necessity of providing an light source for the alignment system 180. In addition, the reference mark or the alignment mark can be detected by using illumination light having the same wavelength as that of exposure light, and accurate mark detection can be implemented. That is, the alignment system 180 radiates illumination light AL having the same wavelength of exposure light onto the alignment mark and onto a reference mark on the reference mark plate FM through the projection optical system 165. In addition, the alignment system 180 uses an image-capturing device (CCD) to receive light generated from the aforementioned two marks, and is used for, for example, alignment of the reticle 163 and baseline measurement of the alignment system 181.

The off-access alignment system 181 radiates white light (broad band light) having a wavelength in width of about 550 to 750 nm onto the alignment mark on the wafer 166. In addition, the alignment system 181 causes an image of an index mark and an image of the alignment mark to be imaged on the image-capturing device (CCD), and detects positional displacements of the two marks.

In this case, when the alignment systems 180 and 181 are used to individually detect the reference mark on the reference mark plate FM, the amount of the baseline (gap between the detection center and the exposure center) can be measured from the detection results. Alignment of each shot region of the wafer 166 is implemented at high accuracy according to this result and the measurement result of the alignment system 181. The baseline measurement is performed prior to the start of exposure of the wafer. However, the baseline measurement may be performed each time the wafer is replaced; or alternatively, the measurement may be performed at a ratio of about one time with respect to the exposure operation for a plurality of wafers. However, the baseline is inevitably measured after the reticle has been replaced.

The optical fiber (including the optical fiber amplifier and the like) used in the above-described embodiment may preferably be covered with a low-degassing material, such as Teflon or fluorine-based resin. Foreign matters (including fibrous matters and the like) occurred from the optical fiber can be contaminants that contaminates, and the optical fiber is covered as described above to prevent the occurrence of the contaminants. However, instead of covering the optical fiber with the Teflon or the like, the optical fibers disposed in chambers may be collectively stored in a stainless steel housing.

The exposure apparatus of the above-described embodiment shown, for example, in FIG. 7, may include a spatial-image measuring system. The spatial-image measuring system may be such that the mark provided on the reticle 163 and the reference mark provided on the reticle stage 164 are illuminated with illumination light having the same wavelength, and a mark image formed by the projection optical system 165 is detected through an opening (such as a slit) provided on the wafer stage 167. In this case, for a light source generating the illumination light for the spatial-image measuring system, a light source having the same configuration as that of the above-described light source (171 and 179) may be separately provided. Alternatively, the exposure-dedicated light source formed of the members including the exposure light source 171 and the illumination system 162 may be shared.

The exposure apparatus of the above-mentioned embodiment can be manufactured in the following manner. The illumination optical system and the projection optical system, which are formed to include the plurality of lenses, are built into the exposure apparatus mainbody, and are optically adjusted. The configuration members such as the reticle stage and the projection optical system, which are formed of many mechanical components, are assembled to the exposure apparatus mainbody; and wirings, pipings, and the like are connected. In addition, the total adjustment (including electrical adjustment and operational verification) is performed. The exposure apparatus is preferably manufactured by a so-called "clean room" for which environmental factors, such as the temperature and the cleanliness are managed.

The semiconductor device is manufactured according to various processing steps. The processing steps including a step of designing functions and performance of the device; a step of manufacturing a reticle according to the aforementioned step; a step of manufacturing a wafer from a silicon material; a step of exposing the wafer to a pattern of the reticle by using the exposure apparatus of the above-described embodiment; a step of device assembly (the step includes a dicing step, a bonding step, and a packaging step); and an inspecting step.

Moreover, the present invention may also be applied to the manufacture of other devices. The devices include display devices such as a liquid crystal display device and a plasma display device; thin-film magnetic disks; micromachines; and various devices such as DNA chips. Moreover, the present invention may be applied to the manufacture of a photomask for a projection exposure apparatus.

The laser device in the exposure apparatus of the present invention may also be applied to a laser-repairing unit used to cut a part (such as a fuse) of a circuit pattern formed on a wafer. In addition, the laser device may also be applied to a testing apparatus that uses visible light or infrared light. In this case, the above-described wavelength conversion section need not be built in the laser device. Thus, the present invention is effective for not only the ultraviolet light generator, but laser devices that generate fundamental waves of either a visible region or an infrared region and that do not have a wavelength conversion section.

In addition, the laser device of the present invention can be used not only as the light source of the exposure apparatus, the testing apparatus, or the like used in the device-manufacturing step, but also as a light source of various other apparatuses, regardless of the use and like thereof (an example is an conventional apparatus using an excimer laser as a light source, such as a laser medical treatment apparatus for performing medical treatment for, for example, the near site and the astigmatism, by correcting, for example, the curvature or the irregularity of the cornea).

The present invention regarding the exposure apparatus may be applied to a proximity exposure apparatus that performs exposure for a mask pattern in a state where a mask and a substrate are proximately set without using a projection optical system.

The present invention is not limited to the above-mentioned embodiments, and the invention may, as a matter of course, be embodied in various forms without departing from the gist of the present invention. Furthermore, the entire disclosure of Japanese Patent Application 11-258133 filed on Sep. 10, 1999 including description, claims, drawings and abstract are incorporated herein by reference in its entirety.

INDUSTRIAL APPLICABILITY

According to the present invention, since the optical fiber amplifiers are used, the small laser device having a high maintainability can be provided, and the laser device can be used as, for example, an exposure light source and an inspecting light source of an exposure apparatus.

In addition, the conversion efficiency in the wavelength conversion section can be improved by using a predetermined nonlinear optical crystal, making an arrangement to mitigate the occurrence of "walk-off", or using an optical member for reducing the influence of the "walk-off". In addition, with an exposure apparatus to which the laser device is applied, the throughput can be improved.

Furthermore, when the laser device of the present invention further includes the optical splitter section for splitting a laser beam generated by the laser generator section into a plurality of laser beams, and the optical amplifier sections are discretely provided for the plurality of the split laser beams, the output laser beam can be modulated at a high frequency, the spatial coherence can be reduced, and the oscillation spectral linewidths can be narrowed overall with a simplified configuration.

What is claimed is:

1. A laser device which generates ultraviolet light, comprising:
   a laser light generator which generates mono-wavelength laser light in a wavelength range of from an infrared region to a visible region;
   an optical amplifier including an optical fiber amplifier which amplifies the laser light generated by the laser light generator; and
   a wavelength converter which includes a plurality of nonlinear optical crystals which perform wavelength conversion of the laser light amplified by the optical amplifier, and a plurality of temperature controllers which perform temperature control of the plurality of the nonlinear optical crystals to tune phase matching angles at the time of wavelength conversion, wherein
   the wavelength converter generates ultraviolet light.

2. A laser device which generates ultraviolet light, comprising:
   a laser light generator which generates mono-wavelength laser light in a wavelength range of from an infrared region to a visible region;
   an optical amplifier including an optical fiber amplifier which amplifies the laser light generated by the laser light generator; and
   a wavelength converter which performs wavelength conversion of the laser light amplified by the optical amplifier into ultraviolet light by using a plurality of the nonlinear optical crystals, wherein
   a lithium tetraborate ($Li_2B_4O_7$) crystal is used for at least one of the plurality of nonlinear optical crystals.

3. A laser device as recited in claim 2, wherein
   the wavelength converter generates an eighth-order harmonic wave as ultraviolet light from a fundamental wave of the laser light and a seventh-order harmonic wave thereof according to sum frequency generation, and
   a lithium tetraborate ($Li_2B_4O_7$) crystal is used for a portion which generates the eighth-order harmonic wave.

4. A laser device as recited in claim 2, wherein
   the plurality of the nonlinear optical crystals includes a nonlinear optical crystal for which a GdYCOB crystal is used, in addition to the nonlinear optical crystal for which the lithium tetraborate crystal is used.

5. A laser device which generates ultraviolet light, comprising:
   a laser light generator which generates mono-wavelength laser light in a wavelength range of from an infrared region to a visible region;
   an optical amplifier including an optical fiber amplifier which amplifies the laser light generated by the laser light generator; and
   a wavelength converter which performs wavelength conversion of the laser light amplified by the optical amplifier into ultraviolet light by using a plurality of nonlinear optical crystals, wherein
   a KAB ($K_2Al_2B_4O_7$) crystal is used for at least one of the plurality of nonlinear optical crystals.

6. A laser device as recited in claim 5, wherein
   the plurality of the nonlinear optical crystals includes a nonlinear optical crystal for which the GdYCOB ($Gd_xY_{1-x}Ca_4O(BO_3)_3$) crystal is used, in addition to the nonlinear optical crystal for which the KAB crystal is used.

7. A laser device as recited in claim 5, wherein
   the wavelength converter generates an eighth-order harmonic wave from a fundamental wave of the laser light and a seventh-order harmonic wave thereof according to sum frequency generation, and
   a KAB crystal is used for a portion which generates the eighth-order harmonic wave.

8. A laser device as recited in claim 5, wherein
   the wavelength converter generates an eighth-order harmonic wave from a fourth-order harmonic wave of the laser beam according to second-order harmonic generation, and
   a KAB crystal is used for a portion which generates the eighth-order harmonic wave.

9. A laser device which generates ultraviolet light, comprising:
   a laser light generator which generates mono-wavelength laser light in a wavelength range of from an infrared region to a visible region;
   an optical amplifier including an optical fiber amplifier which amplifies the laser light generated by the laser light generator; and
   a wavelength converter which performs wavelength conversion of the laser light amplified by the optical amplifier section into ultraviolet light by using a plurality of nonlinear optical crystals, wherein
   a GdYCOB ($Gd_xY_{1-x}Ca_4O(BO_3)_3$) crystal is used for at least one of the plurality of the nonlinear optical crystals.

10. A laser device as recited in claim 9, wherein
    the wavelength conversion section includes a portion which generates a fourth-order harmonic wave from a second-order harmonic wave of the laser light,
    a GdYCOB crystal is used for the portion which generates the fourth-order harmonic wave, and the GdYCOB crystal generates the fourth-order harmonic wave according to non-critical phase matching.

11. A laser device which generates ultraviolet light, comprising:
    a laser light generator which generates mono-wavelength laser light in a wavelength range of from an infrared region to a visible region;
    an optical amplifier including an optical fiber amplifier which amplifies the laser light generated by the laser light generator; and
    a wavelength converter which performs wavelength conversion of the laser light amplified by the optical amplifier section into ultraviolet light by using a plurality of nonlinear optical crystals, and which includes the plurality of relay optical systems which relay the laser light among the plurality of the nonlinear optical crystals, wherein
    the plurality of the relay optical systems are each disposed to allow light of one wavelength to pass through.

12. A laser device as recited in claim 11, wherein
    the wavelength converter generates an eighth-order harmonic wave from a fundamental wave and a seventh-order harmonic wave thereof, and when generating the seventh-order harmonic wave, the wavelength converter uses the sum frequency generation of two light waves of fundamental, second-order harmonic, fifth-order harmonic, and sixth-order harmonic waves to generate the seventh-order harmonic wave.

13. A laser device which generates ultraviolet light, comprising:

a laser generator section which generates mono-wavelength laser light in a wavelength range of from an infrared region to a visible region;

an optical splitter section which splits the laser light generated by the laser generator into a plurality of luminous fluxes;

a plurality of optical amplifiers which amplifies each of the plurality of luminous fluxes split by the optical splitter section by using an optical fiber amplifier; and a wavelength converter which performs wavelength conversion of laser light of a bundle of the plurality of the luminous fluxes from the plurality of the optical amplifier into ultraviolet light by using a plurality of nonlinear optical crystals, wherein the wavelength converter includes a nonlinear crystal which generates a harmonic wave according to sum frequency generation of a first beam composed of a fundamental wave or a harmonic wave of the laser light and a second beam composed of a harmonic wave of the laser light, and an anisotropic optical system having magnifications which are different in two directions crossing with each other to match the individual magnitudes of the plurality of the luminous fluxes composing the first beam to the individual magnitudes of the plurality of the luminous fluxes composing the second beam.

14. A laser device as recited in claim 13, wherein the anisotropic optical system is either a cylindrical-lens array including the same number of lens elements as that of the plurality of the luminous fluxes composing the laser beam or a prism array.

15. A laser device as recited in claim 11, wherein the ultraviolet light has a wavelength of about 200 nm or shorter, and one of lithium tetraborate and KAB crystals is used for a last-stage nonlinear optical crystal of the plurality of the nonlinear optical crystals which generates the ultraviolet light.

16. A laser device as recited in claim 15, wherein a GdYCOB crystal is used for at least one nonlinear optical crystal which is different from the last-stage nonlinear optical crystal.

17. A laser device which generates ultraviolet light, comprising:

a laser generator which generates mono-wavelength laser light;

an optical amplifier including an optical fiber amplifier which amplifies the laser light; and a wavelength converter which performs wavelength conversion of the amplified laser light into ultraviolet light having a wavelength of about 200 nm or shorter by using a plurality of nonlinear optical crystals, wherein one of lithium tetraborate and KAB crystals is used for a last-stage nonlinear optical crystal of the plurality of the nonlinear optical crystals which generates the ultraviolet light.

18. A laser device as recited in claim 17, wherein a GdYCOB crystal is used for at least one nonlinear optical crystal which is different from the last-stage nonlinear optical crystal.

19. A laser device as recited in claim 1, further comprising an optical splitter section which splits the laser light generated by the laser generator into a plurality of laser beams, wherein the optical amplifier are independently provided for the plurality of split laser beams, respectively, and the wavelength converter collects fluxes of laser beams output from the plurality of the optical amplifier and performs wavelength conversion thereof.

20. A laser device as recited in claim 1, wherein the laser generator generates a mono-wavelength laser light having a wavelength of near 1.5μm, and the wavelength converter converts a fundamental wave having the wavelength of near 1.5 μm output from the optical amplifier into ultraviolet light of an eighth-order harmonic wave and a tenth-order harmonic wave, and outputs the ultraviolet light.

21. A laser device as recited in claim 1, wherein the laser generator generates a mono-wavelength laser light having a wavelength of near 1.1 μm, and the wavelength converter converts a fundamental wave having the wavelength of near 1.1 μm output from the optical amplifier into ultraviolet light of seventh-order harmonic wave, and outputs the ultraviolet light.

22. An exposure method, comprising irradiating ultraviolet light generated by the laser device as recited in claim 1, onto a mask, and exposing a substrate with the ultraviolet light passed through a the mask.

23. An exposure apparatus, comprising:

a laser device as recited in claim 1, an illumination system which irradiates a mask with ultraviolet light from the laser device, and a projection optical system which projects an image of a pattern of the mask onto a substrate, wherein the substrate is exposed with the ultraviolet light passed through the pattern of the mask.

24. A manufacturing method of an exposure apparatus which illuminates a mask with ultraviolet light, and which exposes a substrate with the ultraviolet light passed through a pattern of the mask, comprising disposing a laser device as recited in claim 1, an illumination system which irradiates a mask with ultraviolet light from the laser device, and a projection optical system which projects an image of a pattern of the mask onto a substrate, with a predetermined relationship.

25. A device manufacturing method including transferring a mask pattern onto a substrate through us of the exposure method as recited in claim 22.

26. A light irradiation apparatus used in manufacturing a device, the light irradiation apparatus comprising:

the laser device as recited in claim 1; and an optical system optically connected to the laser device, wherein ultraviolet light generated from the laser device is directed onto an object through the optical system.

27. A laser device as recited in claim 1, wherein the laser light generator includes a mono-wavelength oscillatory laser and a light modulator and generates the laser light through pulse oscillation, and the laser device further comprises an adjustment device which adjusts an oscillation property and generates the laser light through pulse oscillation, and the laser device further comprises an adjustment device which adjusts an oscillation property of the ultraviolet light generated from the wavelight converter by at least one of the mono-wavelength oscillatory laser and the light modulator.

28. A laser device as recited in claim 27, wherein the oscillation property includes at least one of a wavelength, an intensity and an oscillation interval of the ultraviolet light, and the adjustment device adjusts the oscillation property by detecting light having a wavelength different from the wavelength of the ultraviolet light.

29. A laser device as recited in claim 2, wherein the plurality of nonlinear optical crystals includes a nonlinear optical crystal used in NCPM (Non-Critical Phase Matching).

30. A laser device as recited in claim 2, wherein
the laser light generator includes a mono-wavelength oscillatory laser and a light modulator and generates the laser light through pulse oscillation, and the laser device further comprises an adjustment device which adjusts an oscillation property of the ultraviolet light generated from the wavelength converter by at least one of the mono-wavelength oscillatory laser and the light modulator.

31. A laser device as recited in claim 30, wherein
the oscillation property includes at least one of a wavelength, an intensity and an oscillation interval of the ultraviolet light, and the adjustment device adjusts the oscillation property by detecting light having a wavelength different from the wavelength of the ultraviolet light.

32. An exposure method which uses the ultraviolet light from the laser device as recited in claim 2, comprising:
irradiating a mask with the ultraviolet light; and
exposing a substrate with the ultraviolet light passed through the mask.

33. An exposure apparatus, comprising:
the laser device as recited in claim 2,
an illumination system irradiates a mask with the ultraviolet light from the laser device, and
a projection system which projects an image of a pattern of the mask onto a substrate, wherein
the substrate is exposed with the ultraviolet light passed through the mask.

34. A light irradiation apparatus used in manufacturing a device, the light irradiation apparatus comprising:
the laser device as recited in claim 2; and
an optical system optically connected to the laser device, wherein
ultraviolet light generated from the laser device is directed onto an object through the optical system.

35. A laser device as recited in claim 5, wherein
the plurality of nonlinear optical crystals include a nonlinear optical crystal used in NCPM (Non-Critical Phase Matching).

36. A laser device as recited in claim 5, wherein
the laser light generator includes a mono-wavelength oscillatory laser and a light modulator and generates the laser light through pulse oscillation, and the laser device further comprises an adjustment device which adjusts an oscillation property of the ultraviolet light generated from the wavelength converter by at least one of the mono-wavelength oscillatory laser and the light modulator.

37. A laser device as recited in claim 36, wherein
the oscillation property includes at least one of a wavelength, an intensity and an oscillation interval of the ultraviolet light, and the adjustment device adjusts the oscillation property by detecting light having a wavelength different from the wavelength of the ultraviolet light.

38. An exposure method which uses the ultraviolet light from the laser device as recited in claim 5, comprising:
irradiating a mask with the ultraviolet light; and
exposing a substrate with the ultraviolet light passed through the mask.

39. An exposure apparatus, comprising:
the laser device as recited in claim 5,
an illumination system which irradiates a mask with the ultraviolet light from the laser device, and
a projection system which projects an image of a pattern of the mask onto a substrate, wherein
the substrate is exposed with the ultraviolet light passed through the mask.

40. A light irradiation apparatus used in manufacturing a device, the light irradiation apparatus comprising:
the laser device as recited in claim 5; and
an optical system optically connected to the laser device, wherein
ultraviolet light generated from the laser device is directed onto an object through the optical system.

41. A laser device as recited in claim 9, wherein
the plurality of nonlinear optical crystals includes a nonlinear optical crystal used in NCPM (Non-Critical Phase Matching).

42. A laser device as recited in claim 9, wherein
the laser light generator includes a mono-wavelength oscillatory laser and a light modulator and generates the laser light through pulse oscillation, and the laser device further comprises an adjustment device which adjusts an oscillation property of the ultraviolet light generated from the wavelength converter by at least one of the mono-wavelength oscillatory laser and the light modulator.

43. A laser device as recited in claim 42, wherein
the oscillation property includes at least one of a wavelength, an intensity and an oscillation interval of the ultraviolet light, and the adjustment device adjusts the oscillation property by detecting light having a wavelength different from the wavelength of the ultraviolet light.

44. An exposure method which uses the ultraviolet light from the laser device as recited in claim 9, comprising:
irradiating a mask with the ultraviolet light; and
exposing a substrate with the ultraviolet light passed through the mask.

45. An exposure apparatus, comprising:
the laser device as recited in claim 9,
an illumination system which irradiates a mask with the ultraviolet light from the laser device, and
a projection system which projects an image of a pattern of the mask onto a substrate, wherein
the substrate is exposed with the ultraviolet light passed through the mask.

46. A light irradiation apparatus used in manufacturing a device, the light irradiation apparatus comprising:
the laser device as recited in claim 9; and an optical system optically connected to the laser device, wherein ultraviolet light generated from the laser device is directed onto an object through the optical system.

47. A laser device as recited in claim 11, wherein the plurality of nonlinear optical crystals includes a nonlinear optical crystal used in NCPM (Non-Critical Phase Matching).

48. A laser device as recited in claim 11, wherein the laser light generator includes a mono-wavelength oscillatory laser and a light modulator and generates the laser light through pulse oscillation, and the laser device further comprises an adjustment device which adjusts an oscillation property of the ultraviolet light generated from the wavelength converter by at least one of the mono-wavelength oscillatory laser and the light modulator.

49. A laser device as recited in claim 48, wherein the oscillation property includes at least one of a wavelength, an intensity and an oscillation interval of the ultraviolet light, and the adjustment device adjusts the oscillation property by detecting light having a wavelength different from the wavelength of the ultraviolet light.

50. An exposure method which uses the ultraviolet light from the laser device as recited in claim 11, comprising:

irradiating a mask with teh ultraviolet light; and exposing a substrate with the ultraviolet light passed through the mask.

51. An exposure apparatus, comprising:

laser device as recited in claim 11, an illumination system which irradiates a mask with the ultraviolet light from the laser device, and a projection system which projects an image of a pattern of the mask onto a substrate,wherein the substrate is exposed with the ultraviolet light passed through the mask.

52. A light irradiation apparatus used in manufacturing a device, the light irradiation apparatus comprising:

the laser device as recited in claim 11; and an optical system optically connected to the laser device, wherein ultraviolet light generated from the laser device is directed onto an object through the optical system.

53. A laser device as recited in claim 13, wherein the plurality of nonlinear optical crystals includes a nonlinear optical crystal used in NCPM (Non-Critical Phase Matching).

54. A laser device as recited in claim 13, wherein the laser light generator includes a mono-wavelength oscillatory laser and a light modulator and generates the laser light through pulse oscillation, and the laser device further comprises an adjustment device which adjusts an oscillation property of the ultraviolet light generated from the wavelength converter by at least one of the mono-wavelength oscillatory laser and the light modulator.

55. A laser device as recited in claim 54, wherein the oscillation property includes at least one of a wavelength, an intensity and an oscillation interval of the ultraviolet light, and the adjustment device adjusts the oscillation property by detecting light having a wavelength different from the wavelength of the ultraviolet light.

56. An exposure method which uses the ultraviolet light from the laser device as recited in claim 13, comprising:

irradiating a mask with the ultraviolet light; and exposing a substrate with the ultraviolet light passed through the mask.

57. An exposure apparatus, comprising:

the laser device as recited in claim 13, an illumination system which irradiates a mask with the ultraviolet light from the laser device, and a projection system which projects an image of a pattern of the mask onto a substrate, wherein the substrate is exposed with the ultraviolet light passed through the mask.

58. A light irradiation apparatus used in manufacturing a device, the light irradiation apparatus comprising:

the laser device as recited in claim 13; and an optical system optically connected to the laser device, wherein ultraviolet light generated from the laser device is directed onto an object through the optical system.

59. A laser device as recited in claim 17, wherein the plurality of nonlinear optical crystals includes a nonlinear optical crystal used in NCPM (Non-Critical Phase Matching).

60. A laser device as recited in claim 17, wherein the laser light generator includes a mono-wavelength oscillatory laser and a light modulator and generates the laser light through pulse oscillation, and the laser device further comprises an adjustment device which adjusts an oscillation property of the ultraviolet light generated from the wavelength converter by at least one of the mono-wavelength oscillatory laser and the light modulator.

61. A laser device as recited in claim 60, wherein the oscillation property includes at least one of a wavelength, an intensity and an oscillation interval of the ultraviolet light; and the adjustment device adjusts the oscillation property by detecting light having a wavelength different for the wavelength of the ultraviolet light.

62. An exposure method which uses the ultraviolet light from the laser device as recited in claim 17, comprising:

irradiating a mask with the ultraviolet light; and exposing a substrate with the ultraviolet light passed throught the mask.

63. An exposure apparatus, comprising:

the laser device as recied in claim 17, an illumination system which irradiates a mask with the ultraviolet light from the laser device, and a projection system which projects an image of a pattern of the mask onto a substrate, wherein the substrate is exposed with the ultraviolet light passed through the mask.

64. A light irradiation apparatus used in manufacturing a device, the light irradiation apparatus comprising:

the laser device as recited in claim 17; and an optical system optically connected to the laser device, wherein ultraviolet light generated from the laser device is directed onto an object through the optical system.

\* \* \* \* \*